(12) United States Patent
Toda

(10) Patent No.: US 8,194,434 B2
(45) Date of Patent: Jun. 5, 2012

(54) RESISTANCE CHANGE MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 271 days.

(21) Appl. No.: 12/605,799

(22) Filed: Oct. 26, 2009

(65) Prior Publication Data

US 2011/0051492 A1    Mar. 3, 2011

(30) Foreign Application Priority Data

Sep. 2, 2009  (JP) .................................. 2009-203056

(51) Int. Cl.
*G11C 11/00* (2006.01)
(52) U.S. Cl. .................... 365/148; 365/189.09; 365/163
(58) Field of Classification Search .................. 365/148, 365/189.09, 163
See application file for complete search history.

(56) References Cited

U.S. PATENT DOCUMENTS

| 7,505,330 | B2 * | 3/2009 | Pawlowski et al. ...... 365/189.05 |
| 2008/0002456 | A1 | 1/2008 | Toda et al. |
| 2009/0003047 | A1 | 1/2009 | Toda |
| 2009/0049366 | A1 | 2/2009 | Toda |
| 2009/0109729 | A1 | 4/2009 | Toda |
| 2009/0122598 | A1 | 5/2009 | Toda et al. |
| 2009/0198881 | A1 | 8/2009 | Toda |
| 2009/0213639 | A1 | 8/2009 | Toda |

FOREIGN PATENT DOCUMENTS

JP    2009-9657    1/2009

OTHER PUBLICATIONS

U.S. Appl. No. 12/403,845, filed Mar. 13, 2009, Haruki Toda.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A resistance change memory device including: a cell array with memory cells arranged therein, the memory cell storing a resistance state as data in a non-volatile manner; a write buffer configured to supply voltage and current to a selected memory cell in accordance with data to be written in it; and a write control circuit configured to make a part of current supplied to the selected memory cell flow out in accordance with the selected memory cell's state change in a write mode.

19 Claims, 40 Drawing Sheets

| mod \ gate | Vm | Vg | read |
|---|---|---|---|
| Read | Vdd | Vg_read | Vdd |
| Reset("0"write) | Vss | Vg_reset | Vss |
| Set("1"write) | Vm_set | >Vdd+Vt | Vss |

Vss<Vm_set~Vg_read<Vg_reset<Vdd
Vdd: Voltage necessary for generating Vset high-R → low-R

| a | A→B | a' | ~A |
|---|-----|----|----|
| b | A→B | b' | ~B | low-R → high-R

| a | A→B | a' | ~B |
|---|-----|----|----|
| b | A→B | b' | B→ ~A | high-R → low-R

| a | A→B | a' | B' |
|---|-----|----|-----|
| b | ~B  | b' | B' | low-R → high-R

| a | A→B | a' | A' |
|---|-----|----|-----|
| b | ~A  | b' | A' |

FIG. 16

|  | set → reset | reset → set |
|---|---|---|
| Vm |  | ≦ |
| Vb |  | ≧ |
| /r2s | H | L |
| /s2r | L | H |

FIG. 17

|  | Cell State | SA Output | Bypass |
|---|---|---|---|
| s2r | Set | L | Off |
|  | Reset | H | On |
| r2s | Reset | H | Off |
|  | Set | L | On |

| IN | out |
|---|---|
| Vc>Vr | H |
| Vc<Vr | L |
| Vc~Vr or gain~1 | L |

Simultaneously Written Cell set cell (100kΩ) — set cell BL
reset cell (3MΩ) — reset cell BL

WL set to reset cell : 0.9V
reset to set cell : 2.0V

WL, Mimic WL1,1' & 2,2'

RESISTANCE CHANGE MEMORY DEVICE

CROSS-REFERENCE TO RELATED APPLICATION

This application is based on and claims the benefit of priority from the prior Japanese Patent Application No. 2009-203056, filed on Sep. 2, 2009, the entire contents of which are incorporated herein by reference.

BACKGROUND OF THE INVENTION

1. Field of the Invention

This invention relates to a resistance change memory device, specifically to a write buffer circuit used therein, with which cell's data state transition may be stabilized.

2. Description of the Related Art

A resistance change memory (i.e., resistive RAM; ReRAM), in which the resistance state of cells is exchanged by voltage, current or heat and it serves as data, is noticed for succeeding the conventional NAND type flash memory. The ReRAM is suitable for shrinking the cell size and for constituting a cross-point cell array, and the cell arrays may be easily stacked. Therefore, it is noticed that a large capacity of file memory may be constructed with a three-dimensional cell array (for example, refer to JP2009-009657A).

One of the features of an ReRAM cell is in that a state change operation from a high resistance state to a low resistance state and the other state change operation from the low resistance state to the high resistance state are different from each other in these electrical conditions. Explaining in detail, for example, the former is characterized as a "voltage operation" while the latter is characterized as a "current operation".

Further, one data transition may be performed with voltage application at a high speed while it takes a long time with current application for performing the other data transition. To keep the cell's state stable after state transition, the circuit load becomes too large. Additionally, in a highly integrated cell array, the influence of the parasitic resistance and capacitance becomes different in accordance with the cell position on a wiring line, so that it becomes difficult to write data with a sufficient margin.

SUMMARY OF THE INVENTION

According to an aspect of the present invention, there is provided a resistance change memory device including:

a cell array with memory cells arranged therein, the memory cell storing a resistance state as data in a non-volatile manner;

a write buffer configured to supply voltage and current to a selected memory cell in accordance with data to be written in it; and a write control circuit configured to make a part of current supplied to the selected memory cell flow out in accordance with the selected memory cell's state change in a write mode.

According to another aspect of the present invention, there is provided a resistance change memory device including:

a cell array with a resistance change-type of memory cells arranged therein, the memory cells being disposed at cross points between word lines and bit lines arranged to cross each other;

a write buffer configured to supply voltage and current to a selected memory cell in the cell array in accordance with data to be written in it;

a current bypass circuit selectively coupled to the output node of the write buffer so as to make a part of current supplied to the selected memory cell flow out;

a reference circuit having a reference resistance for generating a reference voltage serving for detecting the selected memory cell's state change; and a mimic word line circuit having a mimic word line coupled to the reference circuit, the resistance value of the mimic word line being adjusted in accordance with the selected cell's position on a selected word line.

BRIEF DESCRIPTION OF THE DRAWINGS

FIG. 16 shows a setting example of voltages Vm, Vb and selecting signals /rs2, /s2r in accordance with two state transition modes.

FIG. 17 shows the sense amplifier outputs and current bypass states in accordance with the state transition modes.

DETAILED DESCRIPTION OF THE EMBODIMENTS

Illustrative embodiments of this invention will be explained with reference to the accompanying drawings below.

Prior to the detailed explanation of the present invention, the technical background of the present invention will be explained. Suppose here that an ReRAM memory cell is formed of resistance change element (variable resistance element) VR and diode D1 connected in series.

It is also supposed here that variable resistance element VR has a high resistance state and a low resistance state, which are defined as a "reset state" and a "set state", respectively; the variable resistance element in the high resistance state (i.e., reset state) is changed to the low resistance state (i.e., set state) with voltage higher than a certain set voltage "Vset"; and the variable resistance element in the low resistance state is changed to the high resistance state due to Joule heat generated with current larger than a certain reset current "Ireset".

Figure 1:
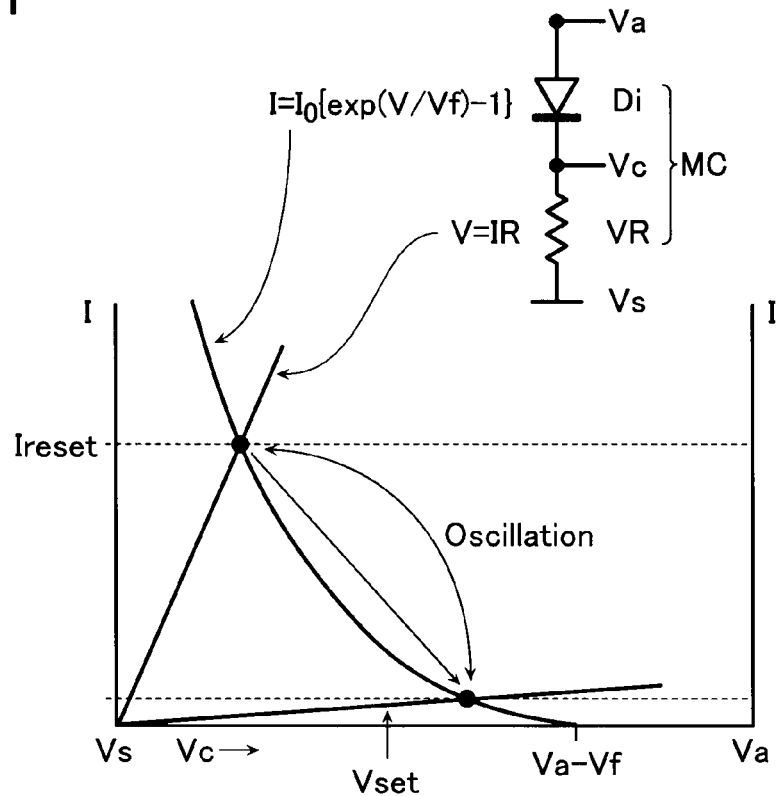
FIG. 1 shows a characteristic of a resistance change memory cell.

If there is not taken a care in the above described basic configuration and operation, data will be oscillated in a write mode. This situation will be explained with reference to FIG. 1, which shows a state change on the characteristics of variable resistance element VR and diode D1.

It is supposed that high level voltage Va (>Vset) and low level voltage Vs are applied to the both ends of the memory cell MC, which is formed of diode D1 and variable resistance element VR connected in series. When the high voltage Va is set to be able to carry reset current Ireset, the following vibration will be generated: If element VR is in a reset state (high resistance state), voltage equal to or higher than the set voltage Vset is applied to the element VR, so that it is changed to the set state (low resistance state); and if element VR is set in the set state, current larger than the reset current Ireset flows therein, so that it is changed to the reset state again.

Therefore, to use the variable element VR as a memory cell in such a manner that, for example, the reset state and set state serve as, for example, data "0" and "1", respectively, it becomes necessary in the cell data writing (programming) mode to control the state of variable element VR without fixing the voltage Va, so as to prevent the element from being oscillated.

In this embodiment, there will be provided a write buffer scheme, which controls the voltage Va applied to the memory cell in a write mode, while suppressing the above-described state oscillation. The write buffer scheme includes: (1) a passive control method for automatically stabilizing the cell state in accordance with the MOS transistor's characteristics; and (2) an active control method for adaptively stabilizing the cell state to be written correspondingly to the main data vibration factors such as a parasitic resistance and the like.

This embodiment is specifically useful in such a case that multi bits are simultaneously written in many cells coupled to a select line. Further, in the above described write scheme, a specification suitable for the write speed will be considered in this embodiment.

The above-described passive control method has already been proposed by this inventor (Japanese Patent Application No. 2008-121594). The brief will be explained below.

The basic consideration is for using the automatic characteristic changes of PMOS transistor and NMOS transistor disposed in the current path to be connected in series to the memory cell in such a way as to: prevent the cell from being applied with set voltage Vset after changing to the reset state when changing the cell to the reset state; and prevent the cell from being applied with reset current Ireset after changing to the set state when changing the cell to the set state.

Figure 2:
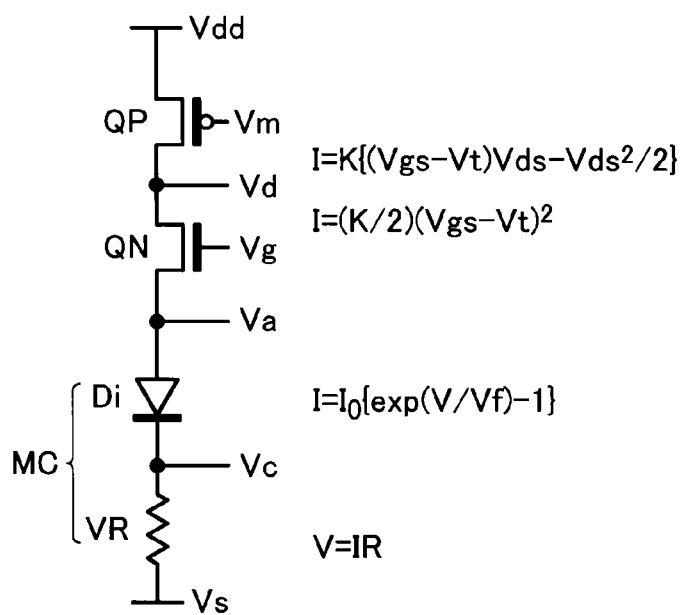
FIG. 2 shows a state stabilizing circuit for automatically stabilizing the cell state.

FIG. 2 shows a state stabilizing method described above. NMOS transistor QN and PMOS transistor QP are additionally inserted in series to the serial circuit of variable resistance element VR and diode D1 to constitute a write buffer. Gate voltages Vg and Vm applied to NMOS transistor QN and PMOS transistor QP are suitably set independently in case of changing to the set state and reset state, respectively, so that the respective state changes are automatically stabilized.

It will be explained in detail with reference to FIG. 2. Here is supposed that source voltage of transistor QP is Vdd; drain voltage of NMOS transistor QN is Vd; anode voltage of diode D1 is Va; and low level side voltage of variable resistance element VR is Vs. These voltages are satisfied with the following relationship of: Vs<Va<Vd<Vdd.

The voltage-current characteristics of the devices used in FIG. 2 are represented as follows.
(1) Variable resistance element VR: I=(Vc−Vs)/R
(2) Diode D1: $I_0[\exp\{(Va-Vc)/Vf\}-1]$; Va−Vc≧Vf
(3) NMOS transistor QN:

$$I=K\{(Vg-Va-Vt)(Vd-Va)-(Vd-Va)^2/2\};\ Vg-Vt \geqq Vd$$

(in the triode region, i.e., current non-saturated region)

$$I=(K/2)(Vg-Va-Vt)^2;\ Vg-Vt<Vd$$

(in the pentode region, i.e., current saturated region)
(4) PMOS transistor QP:

$$I=Kp\{(Vm-Vdd+Vtp)(Vd-Vdd)-(Vd-Vdd)^2/2\};\\ Vd<Vm+Vtp$$

(in the triode region, i.e., current non-saturated region)

$$I=(Kp/2)(Vm-Vdd+Vtp)^2;\ Vd<Vm+Vtp$$

(in the pentode region, i.e., current saturated region)

Figure 3:
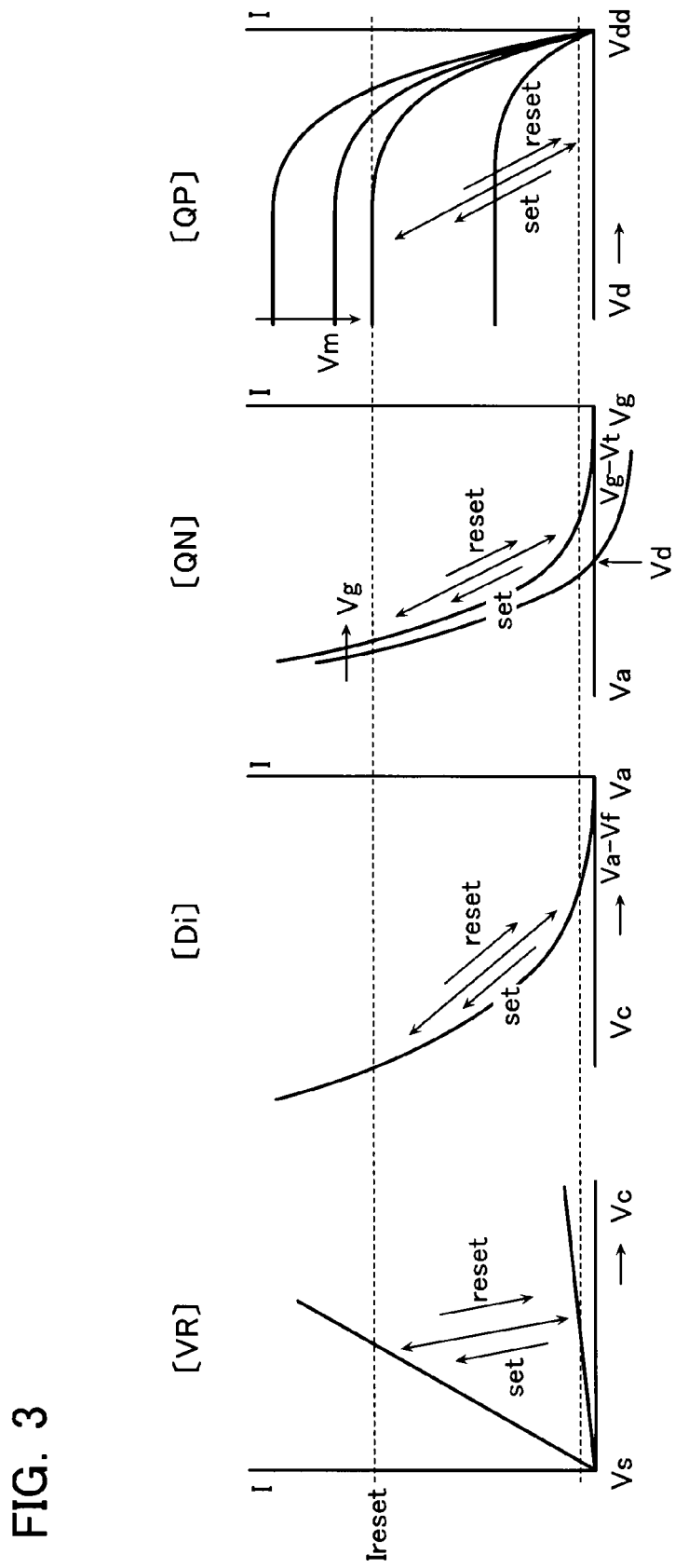
FIG. 3 shows voltage-current characteristics of elements used in FIG. 2.

FIG. 3 shows the characteristic changing of the respective devices in accordance with transitions between the set and reset states, which are arranged on the voltage axis thereof (lateral axis).

At a transition time for the set state, gate voltage Vg is set to be high, so that NMOS transistor QN is set in a non-saturated region, i.e., in a low resistance state, while gate voltage Vm is set to be high, so that PMOS transistor QP is set in a current saturated region to clamp its current to be sufficiently smaller than the reset current Ireset.

On the other hand, at a transition time for the reset state, gate voltage Vm is set to be lower, so that PMOS transistor is set in a sufficiently low resistance state in a non-saturated region to make the vibration of Vd small, while gate voltage Vg is set to be lower, so that NMOS transistor QN is set in a current saturated region to suppress the voltage applied to the variable resistance element to be lower than the set voltage Vset when it becomes in the reset state.

As explained above, the characteristics of NMOS transistor QN and PMOS transistor QP are changed in accordance with the set and reset operations, so that the cell state transitions are automatically stabilized.

Figures 4, 5:
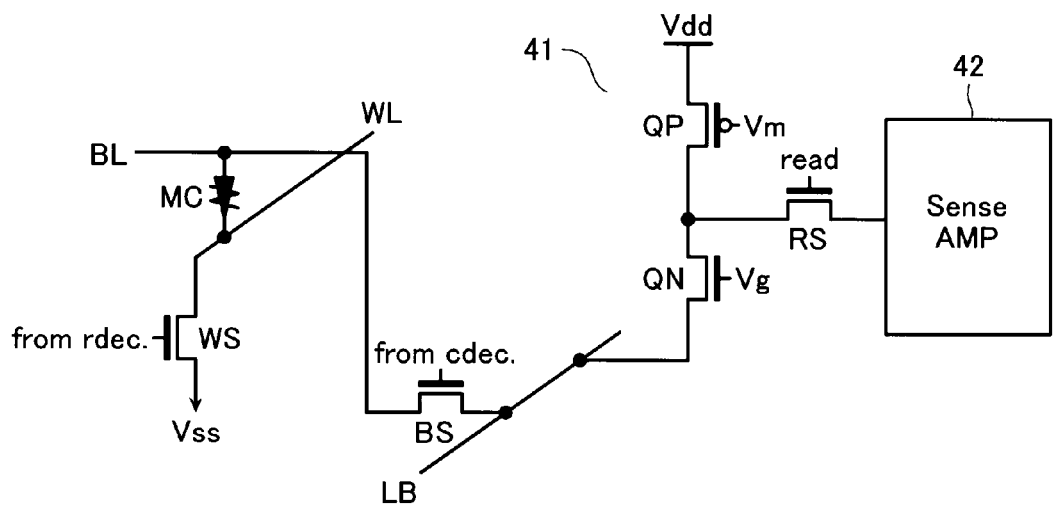
FIG. 4 shows a sense circuit system with a write buffer constituted by the scheme shown in FIG. 2.
FIG. 5 shows the relationship between operation modes and control voltages in the write buffer.

FIG. 4 shows a sense system, to which the above-described passive write control scheme is adapted. Here is shown a memory cell MC symbolically represented by variable resistance element VR and diode D1 connected in series. This symbol will be used in the following drawings.

It is supposed here the cross point cell array is formed in such a manner that the anode side of cell diode is coupled to bit line BL. Word line WL, to which the cathode side of the memory cell MC is coupled, is coupled to ground voltage Vss via word line switch WS. Bit line BL is coupled to local bus LB via bit line switch BS. Local bus LB is coupled to the power supply voltage Vdd via NMOS transistor QN and PMOS transistor QP constituting write buffer 41.

NMOS transistor QN and PMOS transistor QP, the gates of which are applied with Vg and Vm, respectively, are connected in series to the cell for stabilizing the cell state, which correspond to those shown in FIG. 2. The connection node between NMOS transistor QN and PMOS transistor QP is coupled to sense amplifier 42 via read switch RS. It will be used as sense amplifier 42 all the sense amplifiers which are able to detect a difference between a small cell current and a reference current.

Word line switch WS is selected when the gate level is made to be high in receipt of signal "from rdec." supplied from the row decoder. Bit line switch BS is selected when the gate level is made to be high in receipt of signal "from cdec." from the column decoder. Read switch RS is selected when the gate level is made to be high in receipt of signal "read" in a read mode. If these switches are formed of NMOS transistors, the high level gate voltage is set to be equal to or higher than Vdd+Vth (Vth; threshold voltage).

Read signal "read" of the read switch RS, and gate voltages Vg and Vm of NMOS transistor QN and PMOS transistor QP constituting the write circuit 41 will be set, for example, as shown in FIG. 5 in accordance with the state stabilizing method described above.

The voltages shown in FIG. 5 are satisfied with the following relationship of: Vss<Vm_set~Vg_read<Vg_reset<Vdd. That is, Vm is set at Vss in a reset mode, and set at Vm_set in a set mode. Vg is set at Vg_reset in the reset mode, and set at Vdd+Vt or higher than it in the set mode. In the set and reset modes (i.e., in a write mode), read signal "read" is set at Vss, and read switch RS is kept off.

In a read mode, read signal "read" is set at Vdd, and cell data will be read out to sense amplifier SA.

As explained above, selecting the control levels of the respective nodes in correspond with operation modes, the write mode and read mode may be performed stably.

However, the above-described state stabilizing scheme with the passive write controlling method is usable on the assumption that the low level side voltage Vs of the variable resistance element VR is stabilized. If voltage Vs is varied, the operation margin will be reduced, and there is a possibility that the practical condition for achieving the state stabilization is not satisfied due to the variety of characteristics of transistors QN, QP, variable resistance element VR and diode D1.

For example, in order to achieve a memory system with a large capacity, it becomes necessary to write data in parallel into many cells, which are simultaneously selected on a long word line WL, for increasing the data transmission efficiency. In this case, the parasitic resistance and parasitic capacitance of bit line BL and word line WL become a large problem.

Figure 6:
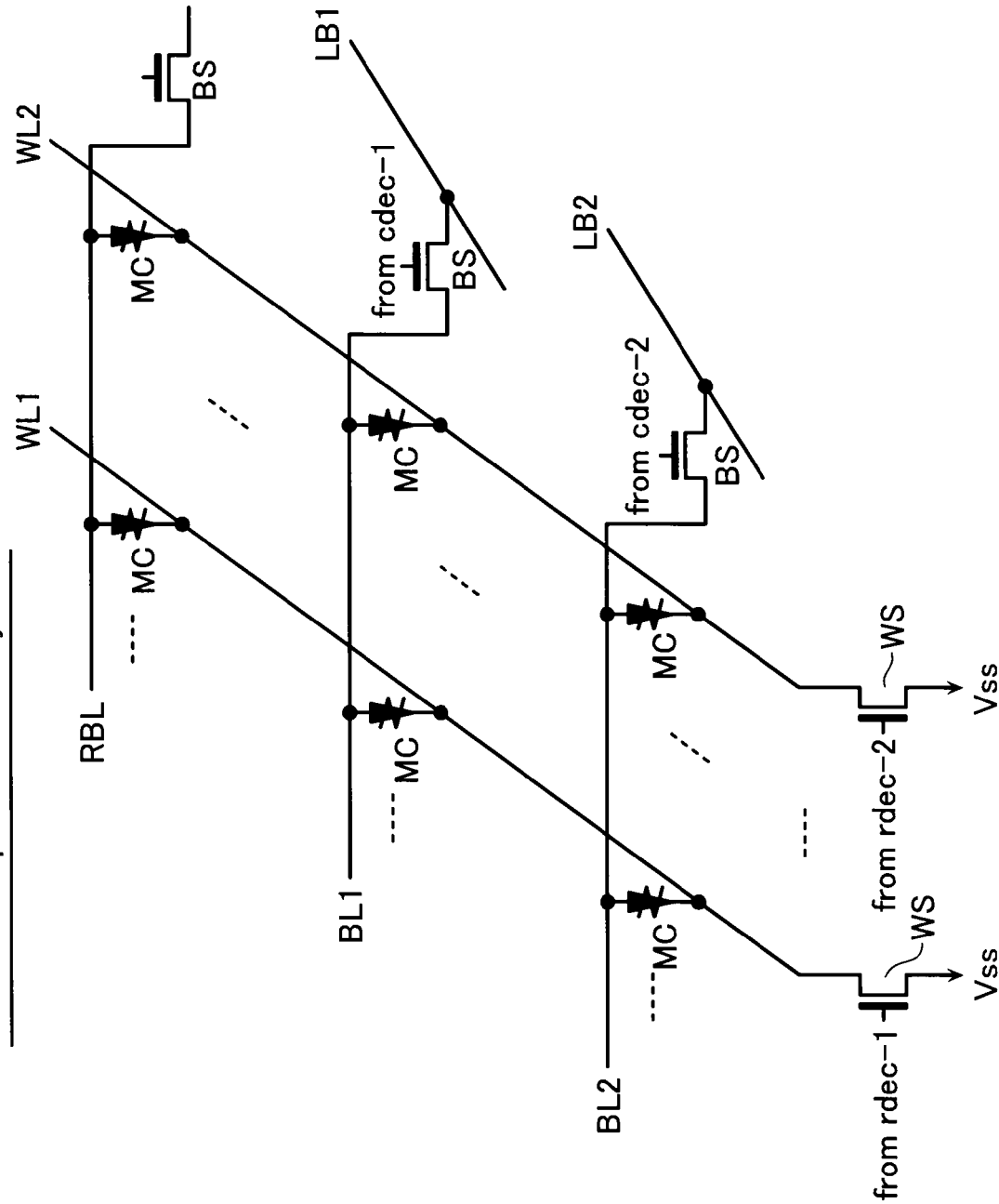
FIG. 6 shows a sense circuit system, which corresponds to multiple bits.

FIG. 6 shows a multi-bit adaptive sense system, which is modified from that shown in FIG. 4. The above-described problem will be explained with reference to FIG. 6.

There are disposed long word lines WL(WL1, WL2, . . . ) and plural bit lines BL(BL1, BL2, . . . ), which cross each other, and memory cells MC are disposed at the cross points. Plural bit lines are individually accessible, and a reference bit line RBL is prepared in common to these bit lines. Data will be written in parallel into multiple memory cells disposed along a selected word line.

Data write is performed with two steps. This is because that the write buffers used for writing cells simultaneously in parallel may be set at the same condition as each other, thereby making the common parts many. That is, data write is performed of: a "0" write step for writing cells from a set state to a reset state; and a "1" write step for writing cells from the reset state to the set state.

If it is permitted for increasing the system complexity, it becomes possible to do "0" write and "1" write simultaneously at one step. However, this leads to sacrificing the data transmission efficiency (for example, refer to JP Application No. 2009-60945).

Plural cells are coupled to a continuous word line WL coupled to the word line switch WS, and a reference bit line RBL and multiple bit lines BL are simultaneously selected with bit line select switches BS. Local buses LB(LB1, LB2, . . . ) are prepared in such a manner that each of them is shared by plural bit lines. Disposed for the respective local buses LB are sense amplifiers and write buffers used for data reading and writing.

When local buses LB to be simultaneously written are selected, and bit lines BL belonging to the selected local bit lines, respectively, are selected, cells disposed at the cross points of the selected bit lines BL and a selected word line WL are simultaneously written.

To increase the number of cells simultaneously written, and to reduce the number of decoders as possible, word line WL is made to be long, so that word line WL contains a large parasitic resistance and a large parasitic capacitance. To adapt the above-described passive write buffer scheme to this case, it becomes necessary, in consideration of the parasitic resistance and capacitance of the word line, to set finely the sizes and gate levels of transistors QN and QP used in each write buffer correspondingly to the respective write buffers.

This is because of that the performance of the passive and automatic state stabilizing scheme depends on the characteristics of transistors in its entirety, and it becomes necessary to set a large margin against the changes of the parasitic resistance and capacitance. However, there is a limit in the above-described finely setting method. If it is required of the buffer to be finely set as to be over the limitations of transistor's characteristics, it becomes difficult to make the word line longer.

Therefore, if there is not used a new write buffer, which is adaptable to an ReRAM cell array with a large capacity, it becomes difficult to increase the cell area in the memory chip, and achieve a high speed data transmission. One method considered as a possibility is a switch scheme, which cuts off the power supply path for cells after completion of the cell state transition. However, this scheme has a problem explained below.

It should be noted here that the write control scheme such as the above-described switch scheme has the following functions. With respect to the transition from a high resistance state to a low resistance state (i.e., "reset to set" transition), it is necessary to prevent the cell from being changed again to the high resistance state with a large current after changing to the low resistance state. With respect to the transition from the low resistance state to the high resistance state (i.e., "set to reset" transition), it is necessary to prevent the cell from being changed again to the low resistance state with a large voltage applied after changing to the high resistance state.

Figures 7, 8, 9:
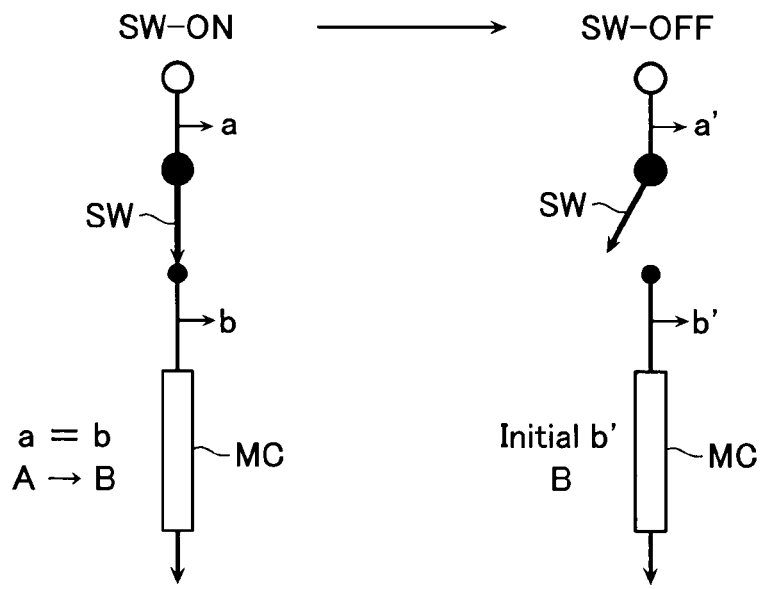
FIG. 7 is a diagram for explaining the problem of a switch scheme.
FIG. 8 shows the node voltage changes in accordance with the cell state transition from a high resistance state to a low resistance state in the switch scheme.
FIG. 9 shows the node voltage changes in accordance with the cell state transition from the low resistance state to the high resistance state in the switch scheme.

As shown in FIG. 7, assuming that switch SW is coupled to memory cell MC, and the generated voltage is changed from "A" to "B" in accordance with the cell state change, the relationship between the power supply node side voltage "a" and cell side node voltage "b" will be examined when the switch SW is off and on.

Switch SW is turned off by monitoring the change of node voltages "a" and "b" as shown in FIG. 7, and monitoring the node voltages "a'" and "b'" after switch off, the switch-off state will be kept.

Supposing that generated voltage "A" is in the high resistance state (high-R state) of cell MC while the generated voltage "B" is in the low resistance state (low-R state) of cell MC, the respective voltages are represented in the table shown in FIG. 8. That is, while switch SW is on, node voltages "a" and "b" are kept as a=b, and generated voltage is changed from "A" to "B". If there is prepared a current regulation element in the power supply circuit, which functions when the cell is set in the low resistance state, voltage "B" will be lower than voltage "A".

If switch SW is turned off in accordance with the state change, voltage "a'" becomes "~A", while voltage "b'" becomes "~B". The former "a'"="~A" is referred to as that as a result of switch off, the power supply side becomes to be equal to the power supply voltage, i.e., becomes higher than the generated voltage "A". The latter "b'"="~B" is referred to as that the cell voltage becomes "~B" lower than the voltage "A" generated before the cell state change due to the discharge of the cell set in the low resistance state.

Therefore, in case of this state change, the state change will not be influenced by the switch-off after the cell state change. In other words, in case the cell is changed from the high resistance state to the low resistance state (i.e., reset to set transition), there is not a problem in the switch scheme. However, without the switch device, inserting a resistive element in the current path of the cell, it becomes possible to easily correspond to the state change.

On the other hand, FIG. 9 shows the respective voltages on the assumption that generated voltage "A" is in the low-R state of cell MC while the generated voltage "B" is in the high-R state of cell MC. That is, in case switch SW is on, the voltage is changed from "A" to "B" higher than "A" while a=b is kept. This will be explained as follows: on the assumption that the voltage source with a low output impedance is used for applying voltage to a low resistance cell, cell MC is changed to the high resistance state, thereby resulting in that the cell voltage becomes high.

If switch SW is turned off in receipt of the above-described state change, voltage "a'" becomes "~B", while voltage "b'" becomes "~A" from "B". The former "a'"="~B" is referred to as that as a result of switch off, the power supply side becomes to be equal to the power supply voltage, i.e., becomes higher "~B" than the voltage "B". The voltage change "B→~A" of "b'" is referred to as that the cell voltage becomes lower "~A" than the voltage generated before the cell state change due to the discharge of the cell set in the high resistance state.

It should be noted here that the change "B→~A" of voltage "b'" is slow because it is a result of natural discharge through the high resistance cell. At this time, it often takes a sufficiently long time to change the cell state because there is a possibility that the cell voltage becomes over a transition threshold value from the high resistance to the low resistance dependently on the voltage "B" and cell characteristic. As a result, there is generated a large possibility that the cell is changed again to the low resistance state. Although it is required of the voltage "b'" to be rapidly discharged, there is not a method excepting the use of long natural discharge of the cell itself because switch SW is off.

As described above, there is a problem in the switch scheme in case of the "set to reset" transition.

In this embodiment, in consideration of the drawback of the above-described switch scheme, a current bypass scheme is used as an improved active write control scheme. In this current bypass scheme, there is disposed a current bypass, which is connected in parallel with the cell current path in corresponding to the cell state transition.

Figures 10, 11, 12:
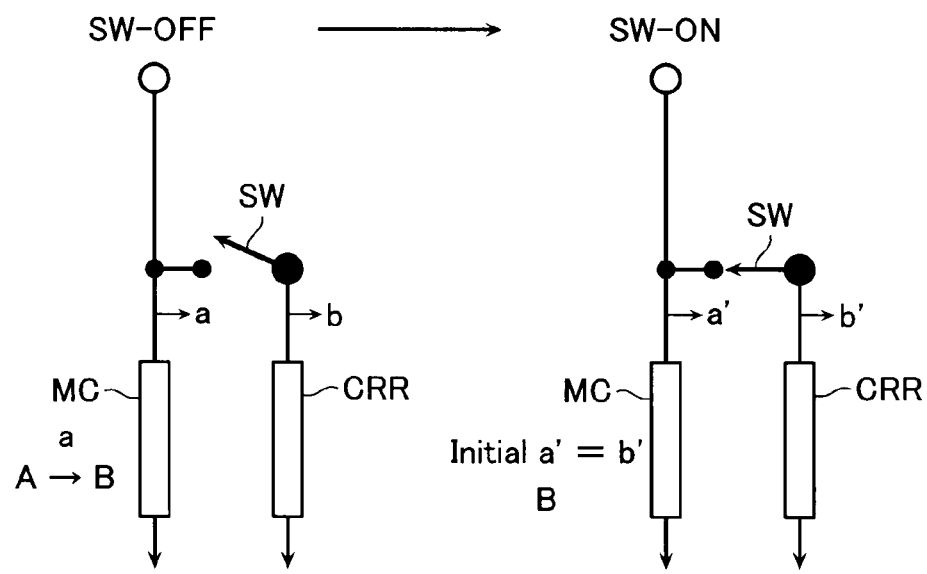
FIG. 10 is a diagram for explaining a current bypass scheme used in the present invention.
FIG. 11 shows the node voltage changes in accordance with the cell state transition from a high resistance state to a low resistance state in the current bypass scheme.
FIG. 12 shows the node voltage changes in accordance with the cell state transition from the low resistance state to the high resistance state in the current bypass scheme.

FIG. 10 is a diagram for explaining the current bypass scheme. As shown in FIG. 10, current regulating resistance CRR is coupled in parallel with memory cell MC via switch SW to serve as a current bypass. Current regulating resistance CRR has a resistance value sufficiently lower than the high resistance state of memory cell MC.

As shown in FIG. 10, it is assumed here that the cell voltage is changed from "A" to "B" in accordance with the cell's state change as similar to the above-described switch scheme. At the beginning in the write mode, switch SW is off. When the cell's state change (voltage change A→B) occurs, and cell voltage "a" is changed from "A" to "B", this state change is monitored, and switch SW is turned on.

In case voltage "A" is in the high-R state while voltage "B" is in the low-R state, node voltages "a" and "b" of cell MC and current regulating resistance CRR while switch SW is off, and node voltages "a'" and "b'" after switch SW on, are shown in FIG. 11. Initial value of voltage "b" is "~B". Voltage level of a'=b' after switch on is medium level "B"' between "B" and "~B". Note here that "~B" is lower than "B", and "B"' is higher than "~B" and near "B".

Therefore, the cell current flowing in accordance with voltage "B" is bypassed in part to the current regulating resistance CRR when switch SW is turned on. This prevents the cell MC from being changed again to the high-R state.

By contrast, FIG. 12 shows the case where "A" is in the low-R state while "B" is in the high-R state. In this case, the initial value of voltage "b" is "~A". When switch SW is turned on, the level of a'=b' is rapidly changed from "~A" to medium level "A"' between "B" and "~A". Note here that "~A" is lower than "A", and "A"' is higher than "~A" and near "A".

Therefore, in place of the cell MC changed to the high-R state, cell current is bypassed in part to current regulating resistance CRR, so that the cell voltage is suppressed to "A"'. As a result, there is not generated the threshold voltage for the cell state transition, and the cell state change will be stabilized.

As explained above, there is provided a compliant and adaptive write buffer system, in which current bypass switch SW is automatically controlled in accordance with the cell state. By use of this system, it becomes possible to perform a data write operation without errors due to the parasitic resistance and parasitic capacitance of a long word line.

Figure 13:
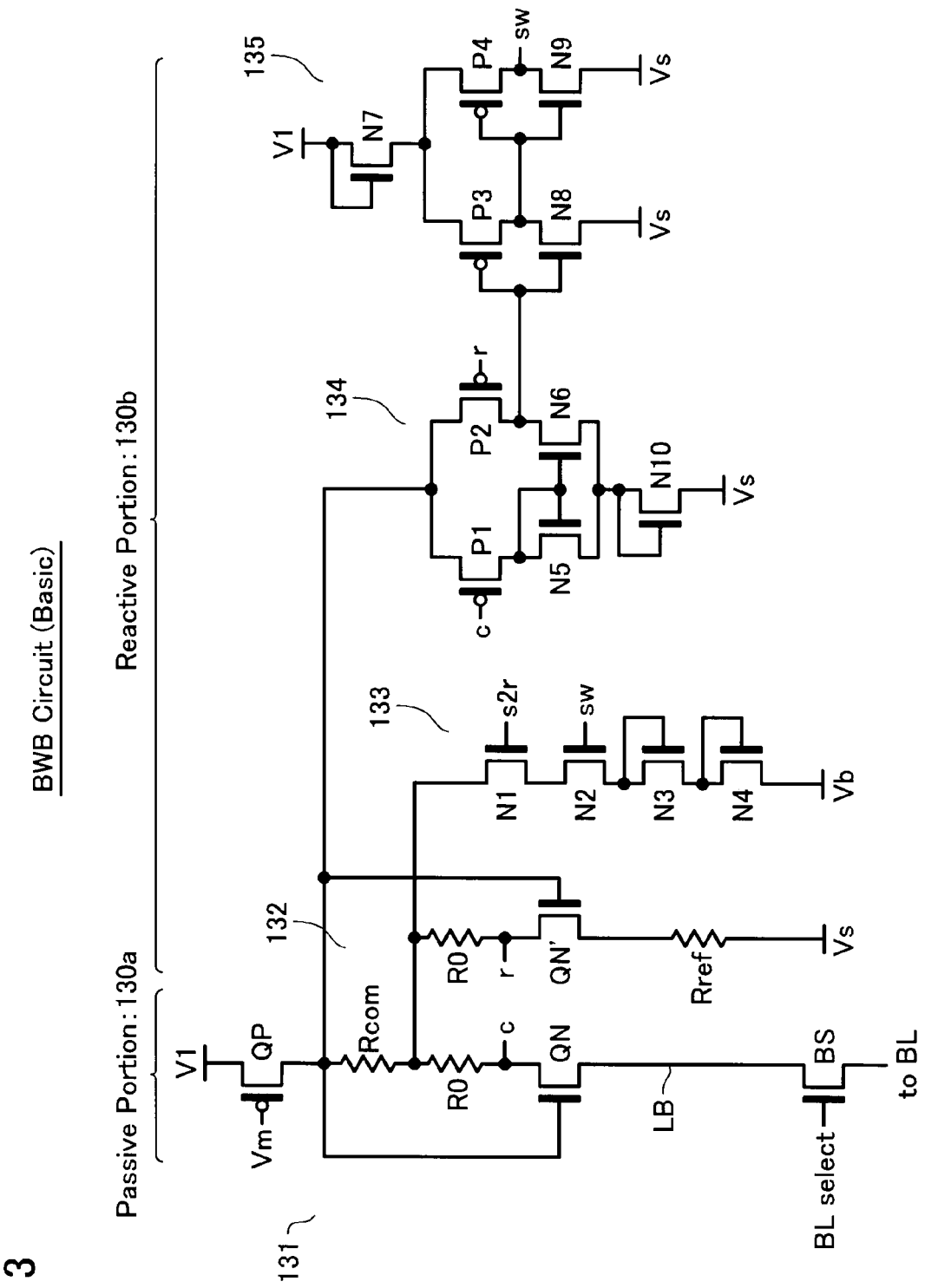
FIG. 13 shows a basic circuit example of a write buffer circuit (BWB circuit) used in an embodiment.

FIG. 13 shows the basic configuration of a compliant write buffer circuit based on the above-described current bypass scheme. This write buffer circuit will be referred to as a "BWB" (Bypass Write Buffer) circuit hereinafter.

Write buffer 131 coupled to local bus LB has PMOS transistor QP, the source of which is coupled to voltage source V1, and NMOS transistor QN connected in series. This write buffer 131 corresponds to the write buffer 41 shown in FIG. 4, and local bus LB is coupled to bit line BL via bit line selection switch BS. Here is omitted that bit line BL is further coupled to a selected word line WL via a selected memory cell.

Resistances Rcom and R0 are inserted in series to the drain node "c" of NMOS transistor QN. Coupled to the connection node between resistances Rcom and R0 is reference circuit 132, which has reference resistance element Rref. Reference resistance Rref is coupled to the connection node between resistances Rcom and R0 via NMOS transistor QN' and resistance R0.

The reference resistance Rref serves for monitoring the current pass node voltage coupled to a selected memory cell via a bit line (i.e., output node voltage of the write buffer) between drain nodes "c" and "r" of NMOS transistors QN and QN', which constitute a pair with a common gate. That is, the reference resistance Rref serves for generating a reference voltage serving for monitoring the cell voltage change, the resistance value of which will be decided in consideration of the parasitic resistance of the cell's current path coupled to the bit line selection switch BS.

Further coupled to the connection node between resistances Rcom and R0 is current bypass circuit 133, which has two switch NMOS transistors N1 and N2, and two diode-connected NMOS transistors N3 and N4 serving as bypass resistance elements.

One switch NMOS transistor N1 is on-driven by signal "s2r" (set to reset). This signal is generated in a "set to reset" write mode (i.e., reset-write mode), in which a selected cell is changed from a set state to a reset state. The other switch NMOS transistor N2 is on-driven by output signal "sw" of sense amplifier 134, which monitors the nodes "c" and "r".

Explaining in detail, signal "sw" is an output signal of the output stage inverter 135 of the sense amplifier 134.

PMOS transistor QP driven by gate voltage Vm serves as a current regulating device in a "reset to set" write mode (i.e., set-write mode), in which a selected cell is changed from the high resistance state to the low resistance state, in such a manner as to prevent the selected cell from being reset again. It has already been explained that a PMOS transistor with a high gate voltage applied functions for limiting current with the constant current property.

In this set-write mode, signal "s2r" is "L" (low), and NMOS transistor N1 is off, so that the current bypass circuit 133 in not activated. As explained above in the switch scheme, if the current regulation functions sufficiently, there is no problem that the current bypass circuit is not activated in this write mode.

The drain node of PMOS transistor QP serving as the power source is divided into four current paths as follows: the first path for the cell; the second path for reference circuit 132; the third path for current bypass 133; and the fourth path for the source Vs of the sense amplifier 134 used for monitoring the cell state. Resistance Rcom inserted in common to the first to third paths is used for influencing the effect of the current bypass to the both nodes "c" and "r" equivalently, which serve as input nodes of the sense amplifier.

Further disposed at the nodes "c" and "r" serving as the input nodes of the sense amplifier 134 are resistances R0 with the same value. These resistances R0 transform the cell current flowing via bit line BL and the reference current (current of reference resistance Rref) to the corresponding voltage levels, respectively. The reference resistance Rref has a resistance value that is determined in consideration of the parasitic resistance of the cell current path after the bit line selecting switch BS.

NMOS transistors QN and QN', the gates of which are driven by the power supply voltage of the sense amplifier 134, are disposed on the lower courses of the monitor nodes "c" and "r". Therefore, the current values are transformed non-linearly to voltages with these transistors, so that voltage levels of the monitor nodes "c" and "r" are influenced clearly by the cell state change. In detail, in case the cell's resistance is low, transistor QN carries larger current because the source level is low, so that the cell becomes actually more low-resistive. By contrast, in case the cell's resistance is high, transistor QN suppresses the cell current because the source level is high, so that the cell appears actually more high-resistive.

Current bypass circuit 133 is activated selectively in a reset-write mode, and turned on when the cell state is changed to the high resistance state, thereby bypassing the cell current in part via the resistance Rcom. That is, when the cell is changed to be low resistive in the "set to reset" transition mode (i.e., transition mode from the low resistance state to the high resistance state), to serve as a current bypass for preventing the cell from being applied with a high voltage, the bypass circuit 133 carries a part of cell current to the power source Vb via NMOS transistors N1 and N2 turned on with signals "s2r" and "sw", and via diode-connected and stacked NMOS transistors N3 and N4. Although the power source Vb may be set at the same level as Vs, there is prepared here an individual power source Vb for the sake of making the current value controllable.

Sense amplifier 134 is a differential amplifier with a pair of driver PMOS transistors P1 and P2, the gates of which are coupled to input nodes "c" and "r", respectively, and NMOS transistors N5 and N6 constituting a current mirror. Note here, other kinds of sense amplifiers may also be used within the limitations of that these serve for current-monitoring as similar to the above-described sense amplifier 134. To make the sense amplifier possible to sense a small input signal change, the drain node of PMOS transistor QP serves as the power source of the sense amplifier.

The output of the sense amplifier 134 is transformed to signal "sw" with a suitable amplitude via inverter 135. Inverter 135 has a power source circuit of diode-connected NMOS transistor N7 and power source V1 prepared independently of the cell current path. As a result, it may be suppressed a situation that the through current of the inverter 135 becomes too large.

It should be noted here that the sense amplifier 134 does not serve as that to be used in a read mode. The reasons of this are as follows: first, the voltage used in a read mode is quite different from that used in a write mode, i.e., higher voltage is used in the write mode; second, it is a small current difference to be sensed in the read mode while it is a large current change to be detected in the write mode; and third, the sensing operation in the read mode is in accordance with timing control while the cell state is to be automatically detected in the write mode.

In the BWB circuit described above, the write buffer 131 becomes a "passive portion" 130a, which serves for automatically limiting the cell current and stabilizing the cell state in the "reset to set" transition mode. By contrast, reference circuit 132, current bypass circuit 133, sense amplifier 134 and inverter 135 constitute a "compliant portion" or a "reactive portion" 130b, which is selectively activated to bypass the cell current, thereby stabilizing the cell state change in the "set to reset" transition mode.

The reactive portion 130b is, explaining in other words, referred to as a "write control circuit", which makes a part of the cell current supplied to the selected cell from the write buffer 131 bypassed in accordance with the written cell's state change.

Figure 14:
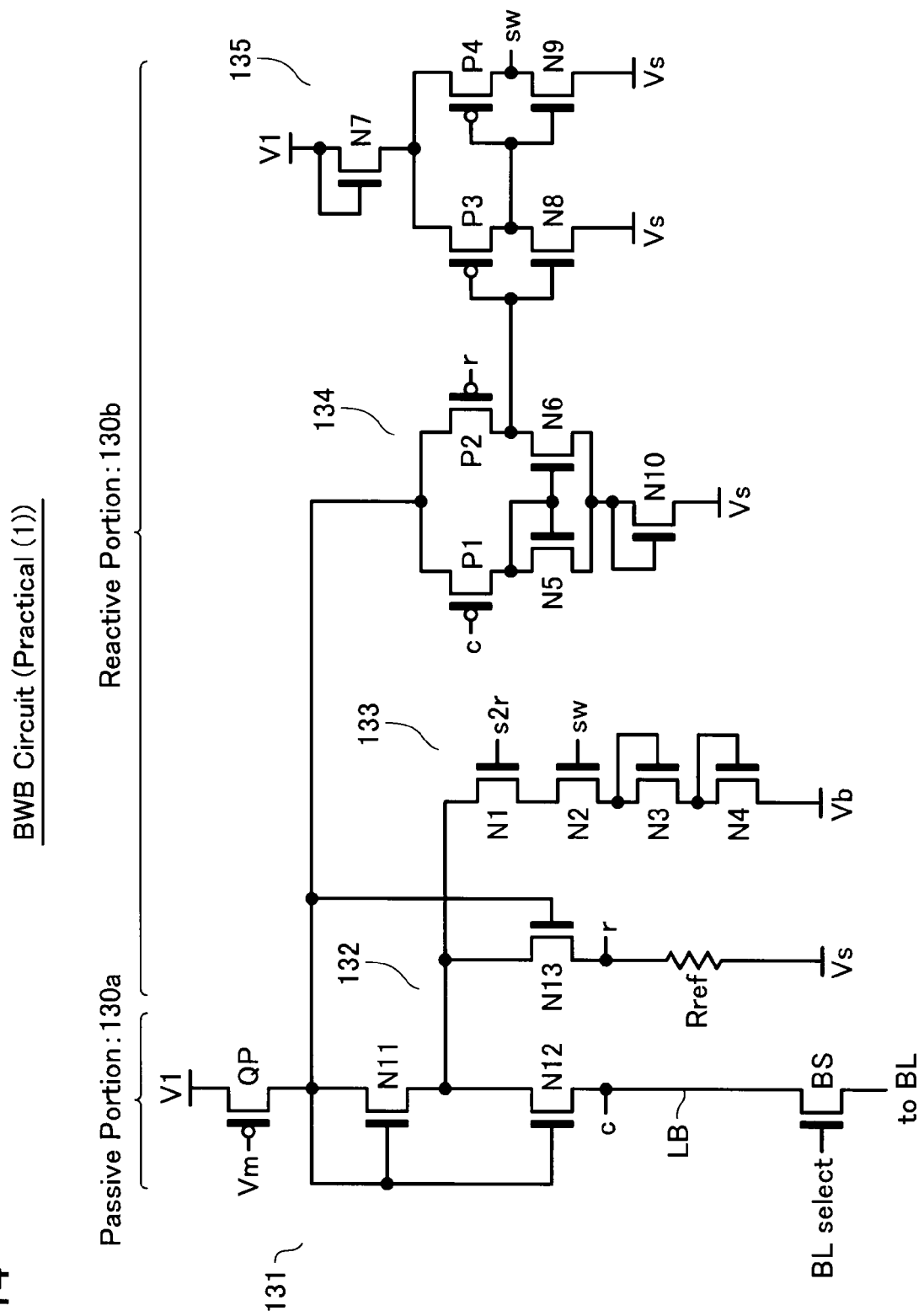
FIG. 14 shows a detailed example of the BWB circuit.

FIG. 14 shows a practical BWB circuit obtained by replacing the resistances used in FIG. 13 with transistors as follows: resistance Rcom is replaced with NMOS transistor N11; and two resistances R0 are replaced with NMOS transistors N12 and N13, which also serve as NMOS transistors QN and QN'. Voltage monitoring nodes "c" and "r" are changed in position to the source nodes of NMOS transistors N12 and N13.

In the BWB circuits shown in FIGS. 13 and 14, current bypass circuit serves for preventing the cell reset in the high resistance state in the "set to reset" transition mode from being set again with a large voltage applied. By contrast, it becomes possible to make the current bypass active in addition to the automatic current limiting function, thereby increasing the operation margin in the "reset to set" transition mode. Such BWB circuit schemes will be explained below.

Figure 15:
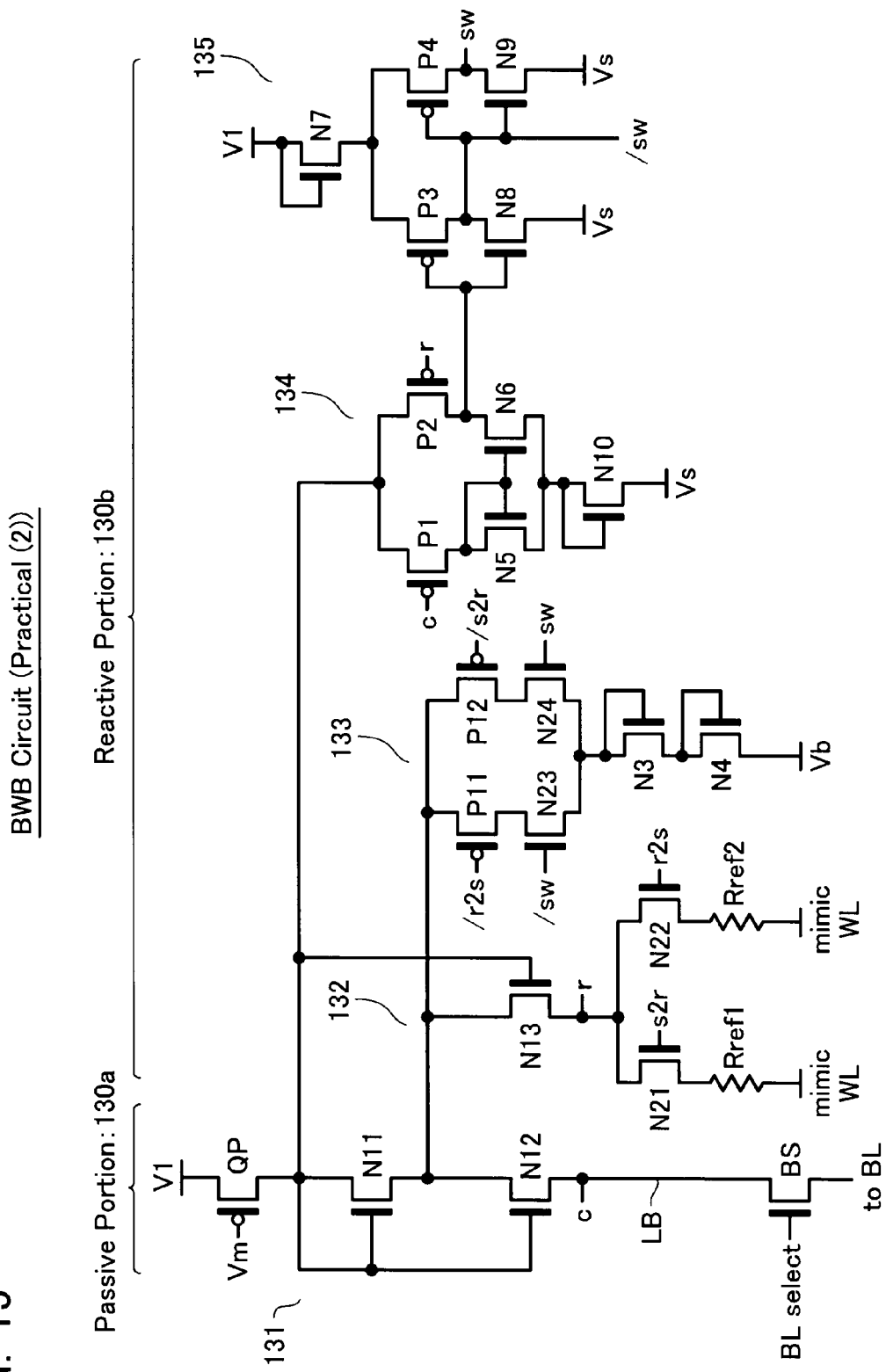
FIG. 15 shows another detailed example of the BWB circuit.

FIG. 15 shows one of such the BWB circuits. The same parts as in FIG. 14 are attached with the same symbols as in FIG. 14, and the detailed explanation will be omitted. The differences between BWB circuits in FIG. 14 and FIG. 15 are as follows:

In the reference circuit 132, two systems of reference resistances Rref1 and Rref2 are prepared to be selectable with switch NMOS transistors N21 and N22, respectively. These NMOS transistors N21 and N22 are on-driven by reset-write selection signal "s2r" and set-write selection signal "r2s" in the "set to reset" transition mode and "reset to set" transition mode, respectively. Therefore, reference resistances Rref1 and Rref2 are set at the suitable reference resistance values necessary in the "set to reset" transition mode and "reset to set" transition mode, respectively.

Further, the reference resistances Rref1 and Rref2 are coupled to not the power source but mimic word lines "mimic WL". The mimic word line has the same length as the normal word line, and plural connection nodes are prepared at different positions on it, which are exchanged and coupled to the reference resistance in the reference circuit in accordance with the selected cell's position on the word line.

Preparing the above-described mimic word line in case the word line is long, it becomes possible to correct the reference resistance value so as to cancel the influence of the word line position. The details of the mimic word line will be explained later.

Current bypass circuit 133 has switch PMOS transistors P11 and P12 driven by selection signals "/r2s" and "/s2r", respectively, and switch NMOS transistors N23 and N24 connected in series to PMOS transistors P11 and P12, respectively, to be driven by selection signals "/sw" and "sw", which are the sensed results of nodes "c" and "r", respectively. One of the diode-connected NMOS transistors N3 and N4 serving as resistance elements may be omitted in accordance with the setting state of the power source V1.

That is, PMOS transistors P11, P12 and NMOS transistors N23, N24 constitute a switch circuit for activating the current bypass in accordance with the write modes and in accordance with the cell state change. It is required of the current bypass circuit 133 to be supplied with complementary signals "/sw" and "sw". Therefore the output inverter 135 is formed to output these complementary signals "/sw" and "sw".

In this BWB circuit, passive portion 130a current-limiting with PMOS transistor QP and reactive portion 130b (i.e., write control circuit) dispersing the cell current flowing in the cell set in the low resistance state are simultaneously used in parallel in the "reset to set" transition mode. The current bypass function of this BWB circuit in the "set to reset" transition mode is the same as above-described one.

Applying the additional function to the reactive portion 130b as described above, it becomes possible to relax the current concentration in the selected word line, and increase the number of cells simultaneously written on the selected word line.

It should be noted that the switch circuit portion driven by operation mode selection signals "/r2s" and "/s2r" in the current bypass 133 are formed of PMOS transistors P11 and P12. As s result, the current patch resistance in the current bypass may be lowered, and the bypass current will be decided by only the sizes of cascade-connected NMOS transistors N3 and N4.

The gate level of the current-limiting transistor QP, the power source level Vb of the front of current bypass circuit 133, and the signal logic levels of "/r2s" and "/s2r" are shown in FIG. 16. There is no need of changing the gate levels "Vm" and "Vb" between "set to reset" transition mode and "reset to set" transition mode.

However, it is also useful to exchange "Vm" and "Vb" in accordance with write modes to finely control them. In this case, as shown in FIG. 16, "Vm" in the "reset to set" transition mode is set to be higher than that in the "set to reset" transition mode, so as to function the current limitation; "Vb" in the "reset to set" transition mode is set to be lower than that in the "set to reset" transition mode, so as to reduce the cell current.

The function of the sense amplifier 134 is not limited to the level comparison between nodes "c" and "r". That is, in case the cell is in the low resistance state, and the current bypass is activated, the power level is lowered extremely, and the sense amplifier is brought into a non-sensitive region. At this time, the sense amplifier needs to output "L" apparently and set the signals "/sw" and "sw" to be "H" and "L", respectively, thereby keeping the current bypass on in the "reset to set" transition mode.

Additionally explaining, it becomes useful to exchange the current amount of the current bypass 133 in accordance with the write modes for making the operations optimal. For example, since the transition time after voltage application is short in general in the "reset to set" transition mode, data write will end soon even if many cells are written simultaneously. Therefore, even if the bypass current is set to be large, it is not necessary for the write buffer to be activated for such a long time that the consumption current becomes problem. What matters at this time is to reduce the cell current after cell state change, thereby increasing the cell numbers to be simultaneously written on a selected word line.

On the other hand, since it takes a long time to change the cell state in the "set to reset" transition mode, it is in need of carrying the bypass current for a long time due to the variation of the cell state transition. Therefore, it becomes necessary to squeeze the bypass current to a minimum in this mode.

FIG. 17 shows the relationship between the output of sense amplifier 134 and on/off of the current bypass circuit 133. In the "reset to set (r2s)" transition mode, the cell's low resistance state and the bypass-on state are overlapped, and the power supply voltage of the sense amplifier is extremely lowered. However, if "L" level output is not kept in the sense amplifier, the bypass will become off. Therefore, it is required of the sense amplifier to have such a characteristic that the "L" level output is kept while the power supply voltage is low and the input differences are little.

Relating to it, it is additionally required of the inverter 135, which functions to transform the output level, to be threshold-adjusted so as to supply signals "/sw" and "sw" to the sense amplifier with a desirable level. It is necessary to consider basically these circuit operations as analog operations.

Figures 18, 19:
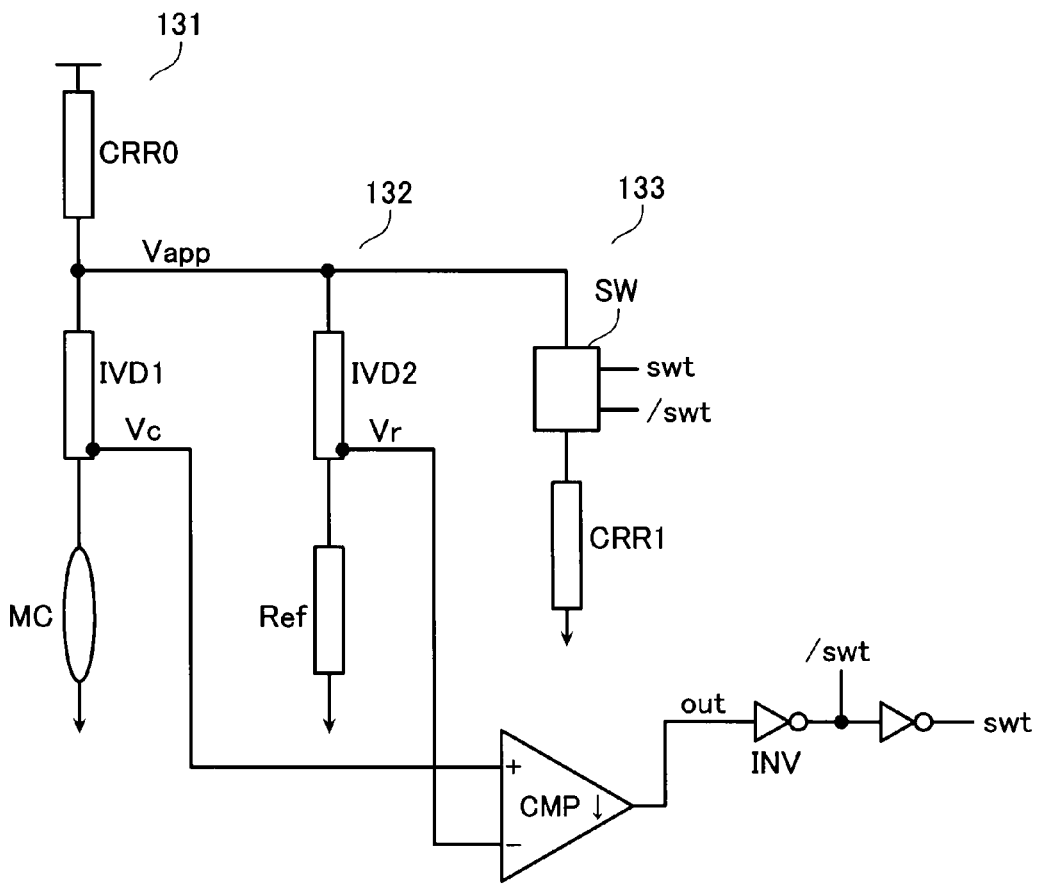
FIG. 18 shows a schematic configuration of the BWB circuit.
FIG. 19 shows the input/output relationship of the comparator in the BWB circuit.

FIG. 18 shows a schematic control system with the BWB circuit, in which a current bypass is used. Coupled to the output node Vapp of the current regulating device CRR0 of the write buffer 131 are three circuit blocks as follows:

The first is a variable resistance type of memory cell MC with a changeable resistance state, which constitutes a current path together with current-voltage transformation device IVD1. The output of this device IVD1 is voltage Vc.

The second is a current path for the reference resistance element Ref, which is coupled to the output node Vapp via a current-voltage transformation device IVD2 similar to IVD1. The output of this device IVD1 is voltage Vr.

The third is switch element SW and current regulating device CRR1 constituting a current bypass. The switch SW is turned on with signals "swt" or "/swt" to bypass a part of cell current from the common node Vapp to the current regulating element CRR1.

Signals "swt" and "/swt" are generated in the comparator CMP and the successive inverter INV. Inputs to be compared in the comparator CMP are "Vc" and "Vr". The relationships between inputs and outputs of the comparator CMP are shown in FIG. 19.

This comparator CMP is characterized in that logic level "L" is to be generated as "output" when Vc and Vr are approximately equal to each other, or the gain of comparator CMP is about 1. This "output" is input to inverter chain, and signals "/swt" and "swt" are obtained to be supplied to turn on and off the bypass current switch circuit SW.

The controllability of switch circuit SW with signals "swt" and "/swt" is dependent on the characteristic of the cell MC, and it will be controlled in such a manner that the level of node Vapp is lowered after changing the cell state based on the relationship between the cell state after transition and the resistance.

What is material for constituting a memory chip with a memory cell array is a memory cell occupation efficiency in respect of the cost; and a data transmission efficiency in respect of the performance. What is material in respect of the cell array is the number of cells coupled to a word line; and the number of cells simultaneously accessed in parallel.

So, a detailed memory chip configuration will be examined below with respect to the relationship between cell array blocks and data buses.

Figure 20:
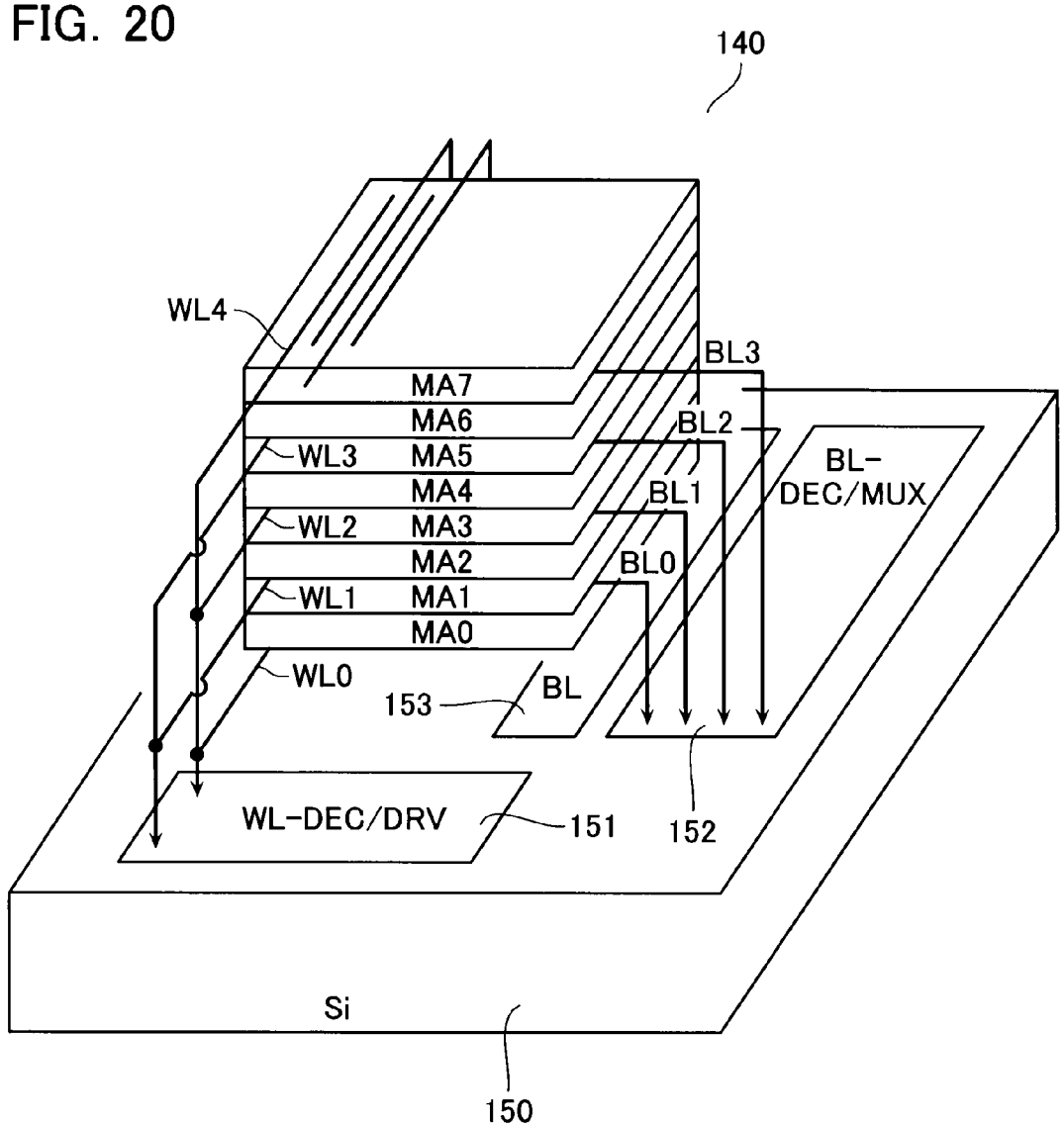
FIG. 20 shows a stacked structure of three-dimensional cell array block in accordance with the embodiment.

FIG. 20 shows a stacked structure of ReRAM cell array block 140. In this example, cell array block 140 includes eight cell arrays MA0-MA7, i.e., eight mats, stacked on a semiconductor substrate 150. It is supposed here that word lines WL and bit lines BL in the respective cell arrays are shared by the adjacent two cell arrays.

Word lines WL are, for example, driven alternately from the both sides of cell array block 140, and coupled to the underlying semiconductor substrate 150 via vertical wirings. For example, even-layered word lines WL0, WL2 and WL4 are connected with each other in the vertical wirings to be driven from word line select circuit (word line decoder/driver DEC/DRV) 151; and odd-layered word lines WL1 and WL3 are also connected with each other in the vertical wirings to be driven from the same.

Bit lines BL0-BL3 in the respective layers are driven independently from vertical wirings disposed on one side of the cell array block 140, and coupled to bit line select circuit (bit line decoder/multiplexer DEC/MUX) 152. Selected bit lines in the select circuit 152 are coupled to local buses LB in data bus area 153. The above-described cell array block 140 serves as a unit in practice, and plural cell array blocks are arranged for achieving a necessary memory capacity.

Although word lines are driven from the both side of the cell array block while bit lines are driven from one side in this example, it is not limited to this. For example, it is permissible that bit lines are driven from the both side while word lines are driven from one side. Alternatively, both of word lines and bit lines may be driven alternately from the both sides of the cell array block.

Figure 21:
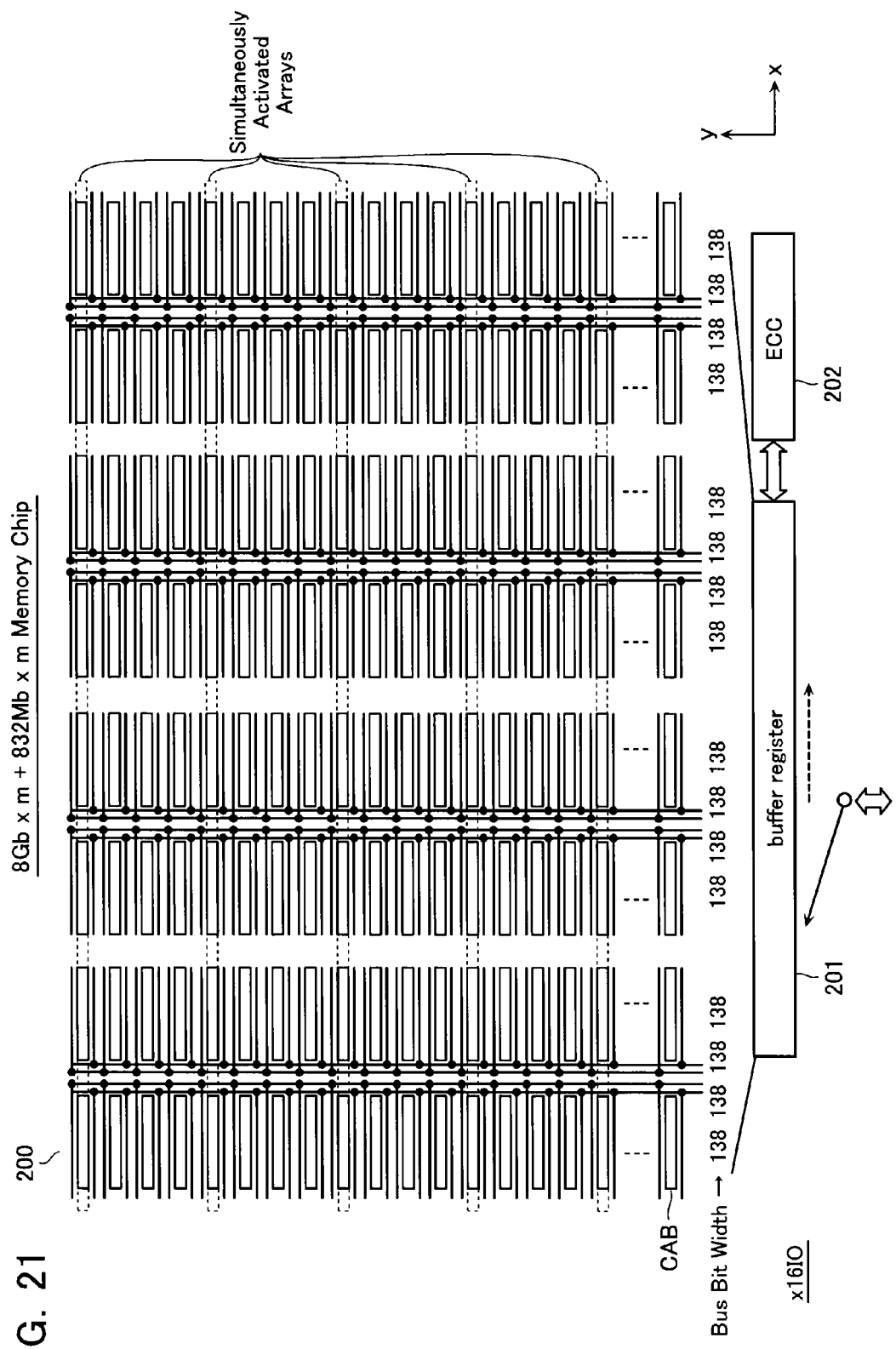
FIG. 21 shows the memory core with cell array blocks arranged.

FIG. 21 shows memory core 200 with 8 Gb+832 Mb/mat, in which cell array blocks CAB expressed by elongated rectangles are arranged. Cell array block CAB is, for example, cell array block 140 shown in FIG. 20, or formed of multiple cell array blocks 140 arranged in the word line direction to serve as a memory unit. The example shown in FIG. 21 is ×16IO type one, in which 16-bit data are read and written in parallel.

Explaining in detail, cell array block CAB is 46 Mb, 8-column CABs and 24-row CABs are arranged in x- and y-directions, respectively, to constitute a cell matrix. One layer contains 8 Gb+832 Mb cells, and "m" layers are stacked, so that the total capacity is equal to 8 Gb×m+832 Mb×m.

In this example, one of the entire memory mats is selected, and a quarter of it are divisionally operated. Cell array block portions surrounded by dotted lines shown in FIG. 21 constitute an access area simultaneously activated. Plural positions dispersed as uniformly as possible in the chip are simultaneously activated.

There is shown here a memory system containing on-chip ECC circuit 202, which is able to correct up to O-bit errors. Check bits to be prepared for 512-bit data serving as an error-correcting unit are 40 bits, and 832 Mb is the capacity of the check bits in each mat.

Data to be read/written at a time from/into the cell array are 128b×16+40b×4, i.e., 138b×4=512b (data part)+40b (check bit part) transferred on 138b buses disposed in the cell array block.

128b data per each IO, which are reciprocated between the chip and the external, serve as a unit referred to as "burst" hereinafter. To hold the burst data, there is prepared a buffer register 201, which stores 138b data including ECC check bits, 40b.

The buffer register 201 and ECC system 202 reciprocate data to correct errors thereof, and corrected data are overwritten in the buffer register 201, and then transferred to the external or the cell array.

For example, there are prepared multi systems of buffer resisters 201, which are interleaved. As a result, it becomes possible to do gapless data read/write. The detailed method of the interleave operations with the buffer registers has been proposed by this inventor, for example, in Japanese Patent Application No. 2008-323524.

It appears from FIG. 21 that the cell occupation efficiency is greatly influenced by the cell block size. That is, as the cell array block is made to be smaller while keeping the number of entire cells, bus area and decode data coupling and decoding area occupied in the chip are increased more and more.

Next, the configuration of the cell array block will be explained in detail below.

Figure 22:
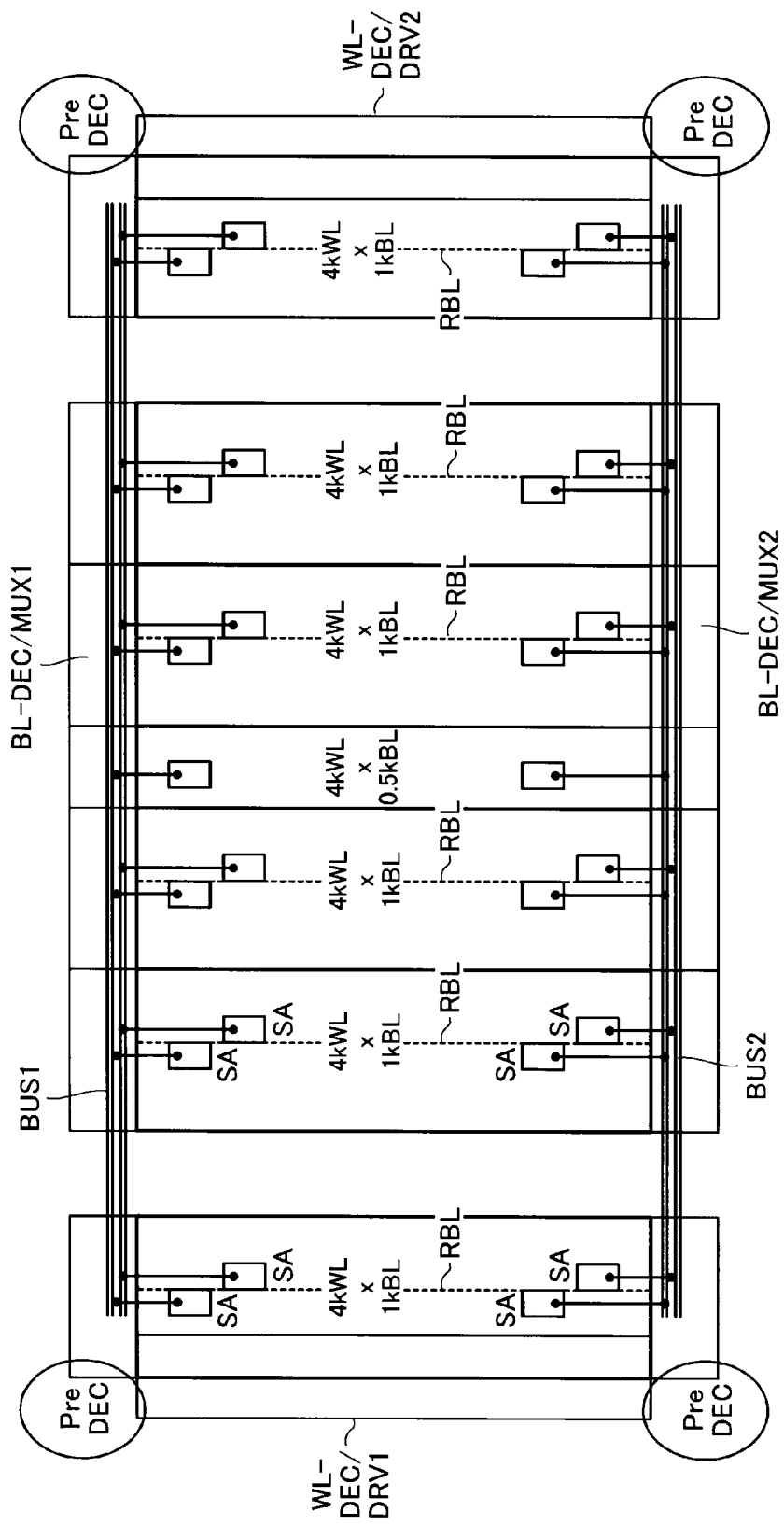
FIG. 22 shows a cell array block.
Figure 23:
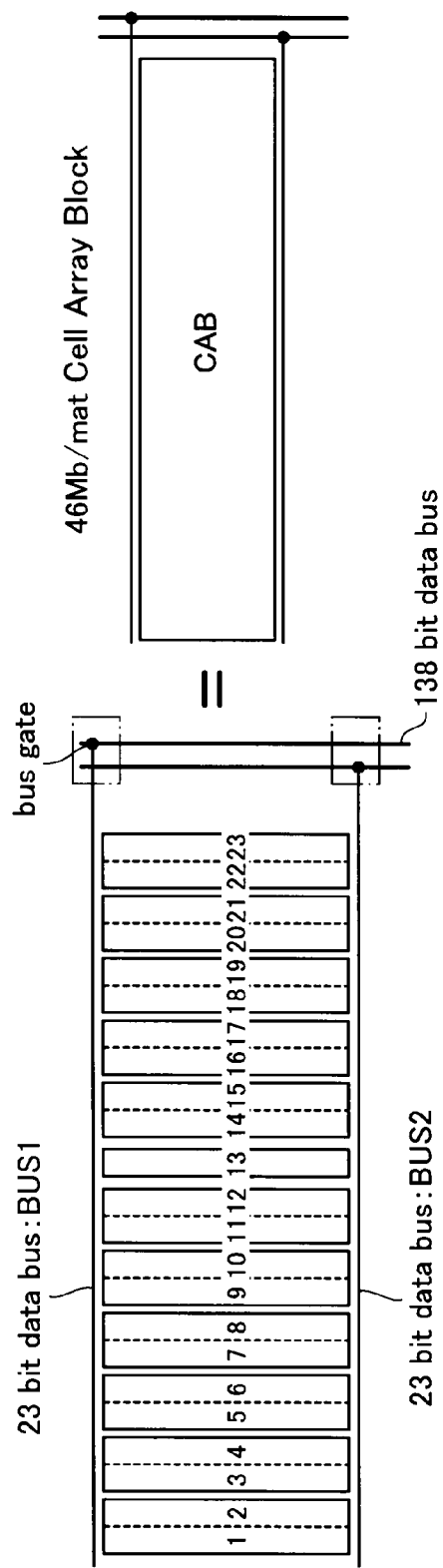
FIG. 23 shows the relationship between a cell array block and the data bus, and the circuit symbol.

FIG. 22 shows the circuit configuration of one cell array block CAB in the above-described memory core 200; and FIG. 23 shows it equivalently in corresponding to that shown in FIG. 21. Using the multi-bit access method for a selected word line, a cell array unit is formed of a great number of cells, One of mats constituting the cell array block CAB (i.e., cell array unit) includes 4 k word lines WL and 1 k bit lines with a reference bit line RBL contained therein shown by a dotted line, and 11.5 cell array units are arranged in line in the word line direction. That is, it is supposed that the capacity of 4 kWL×1 kBL serves as a unit, 46 Mb/mat cell array block CAB may be constructed.

Four sense amplifiers are disposed in each cell array unit, so that total 46 sense amplifiers are disposed in the cell array block CAB. In detail, 23 sense amplifiers are disposed to be coupled to bit line decoder/multiplexer BL-DEC/MUX1, 2 on the both sides of the mat. In other words, each of buses BUS1 and BUS2 contain 23 local buses LB together with address lines, and sense amplifiers are coupled to the 23 local buses.

In this example, word line decoder/drivers WL-DEC/DRV1, 2 are disposed on the both ends of the cell array block CAB in the word line direction. Therefore, when one word line WL is selected, 23+23 bit lines BL are selected from the respective sides, and 46 cells are accessed.

Disposed at the cross points between bit line decoder/multiplexers DEC/MUX1,2 and word line decoder/drivers DEC-DRV1,2 are pre-decoders Pre-DEC, which selectively drive the word line decoder/drivers. The detailed configuration of the pre-decoder has been proposed, for example, by this inventor in Japanese Patent Application No. 2008-221620.

FIG. 23 shows the relationship between the cell array units and data buses in the cell array block CAB. Data buses (local buses) BUS1 and BUS2 passing through the BL-DEC/MUX circuit area of 11.5 cell array units are 23-bit buses, respectively. Disposed on one end of the cell array block CAB is 138-bit data bus, to which buses of the respective cell array units are coupled via bus gates.

When one word line WL is selected in the cell array block, it is desired to be able to access all cells simultaneously in whichever cases 46 cells are selected. However, to avoid the current concentration in one word line WL in the current mode write operation, it is more desirable to classify the selected cells into multiple groups to be sequentially written. In other words, in the "set to reset" transition mode, i.e., "0" write mode, 46 cells coupled to a selected word line are classified into cell groups, which are sequentially written. That is, "0" write cell group is divided into multiple subgroups to be sequentially accessed in a write mode.

Shown in FIG. 23 is an example of the sectioned groups and accessing order thereof. Supposing that the number of cells simultaneously written in the current mode is 2, one mat of the memory cell array block CAB is divided into 23 groups each being formed of 2 Mb. Numbers "1" to "23" designate the respective groups. Sequential selection of the groups may be performed with a shift register.

If it is possible to increase the number of simultaneously written cells more than two, the data transmission efficiency will be increased. Therefore, it is required of the write buffer to be improved.

Note here that the entire groups are simultaneously accessed in the voltage mode write operation (i.e., "1" write mode, or "reset to set" transition mode) and in the read mode, in which an extremely small current flows. Further, there are prepared reference bit lines RBL each being disposed for 1 kBL, and reference cells and normal cells are selected from near circumstances, respectively, so that common disturbance components will be cancelled.

Figure 24:
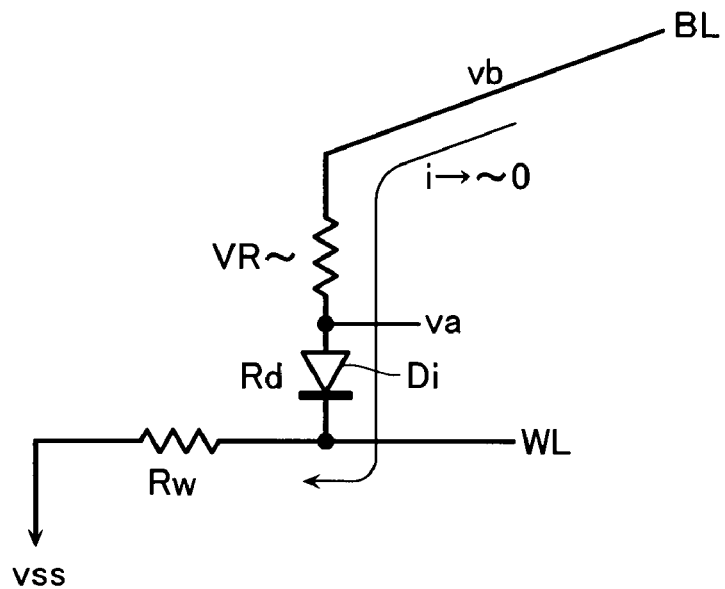
FIG. 24 is a diagram for explaining the problem of the cell data state transition on a long word line.

It will be explained a problem with reference to FIGS. 24 and 25, which is generated when data write is performed on a long word line disposed across the cell array block.

In a cell write mode ("set to reset" transition mode, i.e., reset-write mode), the initial cell resistance is low, and current "i" flows, so that the cell's state change is prepared. At this time, there is generated a voltage drop proportional to the sum of word line resistance "Rw" and on-resistance of the diode "Rd", so that the applied voltage, "vb−va", of variable resistance element VR will be reduced.

Therefore, it is necessary to change the voltage level, "vb", of the bit line BL in accordance with the cell position on the word line WL, thereby securing a voltage level necessary for carrying a sufficient cell current used for cell-resetting.

When the selected cell becomes to have a high resistance value due to the state transition, current "i" becomes about zero. As s result, the voltage drop due to resistance Rw+Rd goes out, and the bit line voltage will be shifted to be higher because the output current of the power supply is decreased and the voltage drop of the output impedance goes out.

Figure 25:
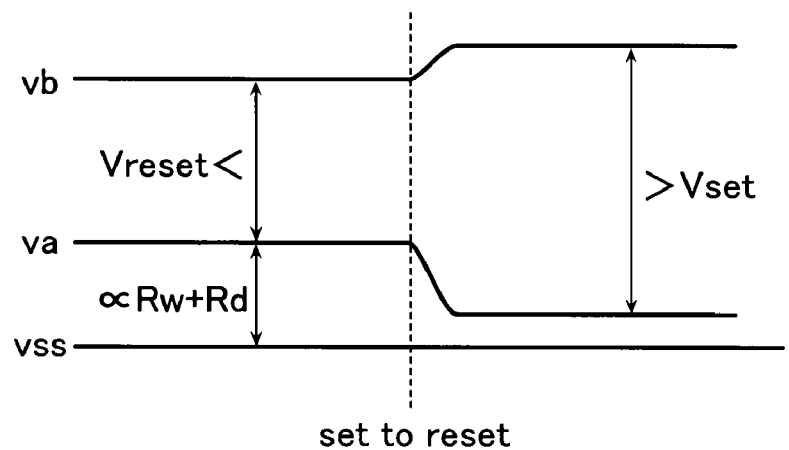
FIG. 25 shows voltage waveforms for showing that the set voltage is applied to the cell after changing from the set state to the reset state.
Figure 26:
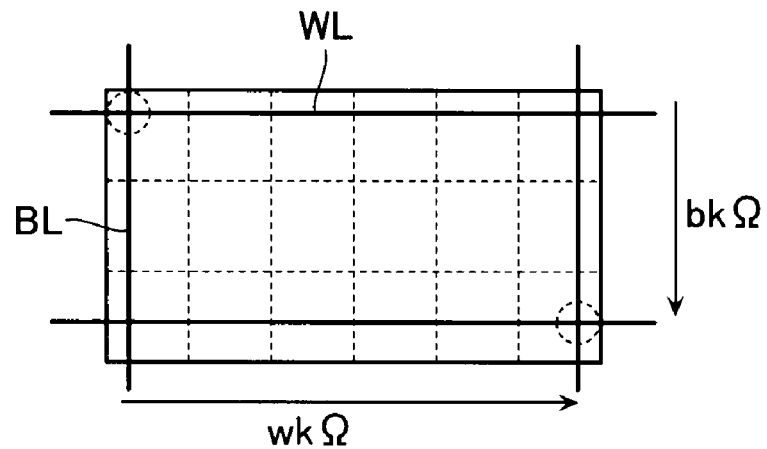
FIG. 26 is a diagram for explaining the cell array division and setting the BWB circuit.

Therefore, in case the voltage drop of the word line WL is large, as shown in FIG. 25, reset cell's voltage becomes to be higher than set voltage Vset, so that the reset cell with a high resistance value will be changed again to be in a set state (low resistance state). In other words, it becomes impossible to reset the selected cell.

This problem may be solved in such a way as to use the above-described BWB circuit as a write buffer, and exchange the specification of the BWB circuit in correspondence to the resistance circumstance of the word line WL. The method of setting the BWB circuit will be explained below.

In the BWB circuit, in which a current bypass is disposed, it becomes possible to change the voltage level on the bit line side within a wide range. In this embodiment, the cell array is sectioned into plural regions in correspondence with the resistance value, each size of which is selected to be covered by a settable BWB circuit, and there are disposed BWB circuits for the respective regions.

For example, supposing that bit line BL and word line WL are b [kΩ] and w[kΩ] in a cell array, respectively, the cell array is sectioned in a matrix manner as shown by dotted lines, and the BWB circuit is set to have different conditions in correspondence with addresses of the sectioned regions in a write mode. In detail, one type of BWB circuit may be adapted to multiple regions by exchanging the circuit parameter. Alternatively, multiple BWB circuits with different parameters pre-set may be disposed for the respective regions.

The cell array sections are decided by the resistance viewed from the BWB circuit. Therefore, when the influence of the bit line resistance is large, the sectioned region may be not a rectangle but a parallelogram, in which adjacent two sides are not perpendicular to each other.

Further, in case bit line BL in the cell array is made to be sufficiently shorter than word line WL, i.e., in case the variation of b[kΩ] is small and there is no need of exchanging the parameter of BWB, it is effective to section only word line direction. In this case, the system will be simple. In the embodiment explained below, there is not sectioned in the bit line direction.

Figure 27:
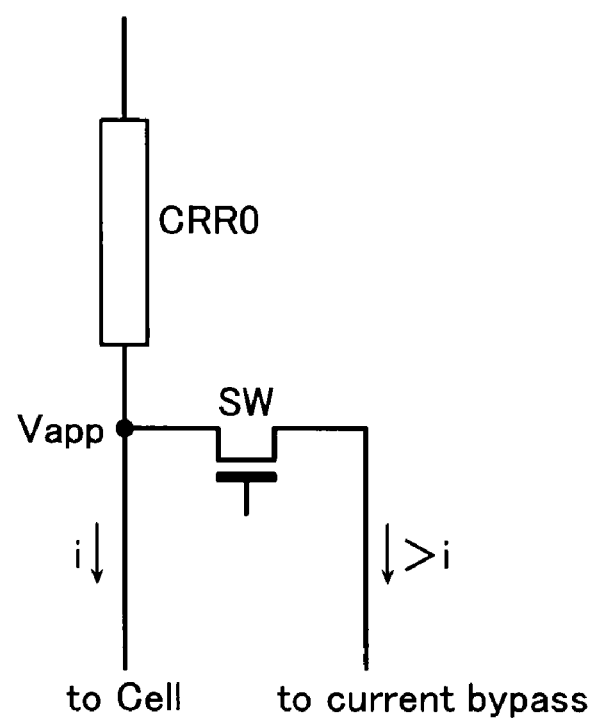
FIG. 27 is a schematic diagram for explaining the state transition stabilizing under the control of bypass current.

As shown in FIG. 27, the parameter setting of BWB is performed in such a way as to change the substantial resistance value of the current regulating device CRR0, and make the bit line voltage level before the cell state change and the voltage drop in the bypass circuit after the cell state change approximately equal to or lower than the voltage drop in the parasitic resistance. For this purpose, the bypass current is set to be larger than the cell current before the cell state change. As a result, the voltage drop in the current regulating device becomes larger after the cell state change, and this will compensate the voltage drop decreasing component in the parasitic resistance.

Therefore, which is to be exchanged in the BWB parameters in correspondence with the word line sections is: the resistance value of the reference resistance Ref; the parameter of the current regulating device CRR0 serving as a power supply circuit for bit line BL; or bypass current value.

Figure 28:
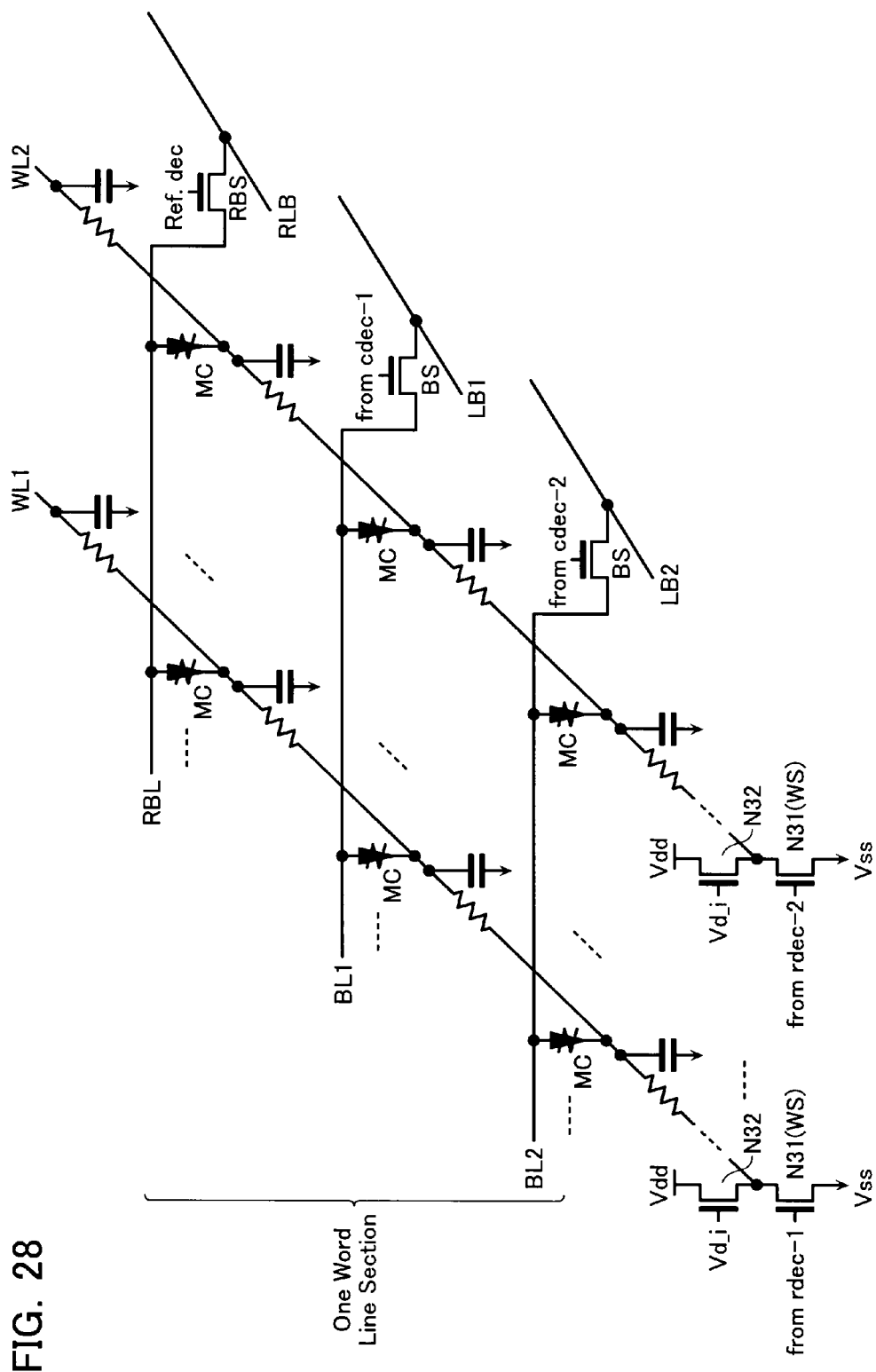
FIG. 28 shows the system of word line division.

FIG. 28 shows a detailed system of word lines WL and bit lines BL, in which BWB circuit is set in parameter in correspondence with sections set in a long word line WL. A number of bit lines BL and word lines WL are classified into a plurality of "word line resistance sections" or "word line sections", each of which is defined as to have a near resistance circumstance of word line WL.

In FIG. 28, BL1 and BL2 are bit lines belonging to one word line resistance section, which are subjected to simultaneously writing. These bit lines BL1 and BL2 are coupled to different BWB circuits via local buses LB1 and LB2, respectively. These different BWB circuits are set to have the same parameter condition as each other.

Reference bit line RBL is prepared in common to plural word line sections, or plural bit lines RBL are disposed in one word line section. Carried in the reference bit line RBL is reference current to be compared with the cell current in a read mode. Reference bit line RBL is coupled to reference local bus RLB via selection switch RBS. Word line resistance sections to be considered in a write mode and bit line blocks to be considered in a read mode which are defined as bit line regions each with a common reference bit line, have no relation to each other because the voltage circumstances in the operations are quite different from each other.

It should be noted that the memory cell connected to the reference bit line RBL is always set in the low resistance state (i.e., data "1") so as to supply reference current to a sense amplifier, which serves for canceling the influences of parasitic resistance and capacitance between bit lines BL and RBL. That is, memory cells belonging to the reference bit line belonging to a word line resistance section will be written into "1" data state with the corresponding BWB set in correspondence to the word line resistance section.

Bit lines RBL and BL are selectively coupled to local buses RLB and LB via bit line selection switches RBS and BS, respectively, which are driven by selection signals "Ref. dec", "from cdec-1" and "from cdec-1" with a sufficiently high level for turning on NMOS transistors. As a result, memory cells on the respective bit bines are written in parallel via the corresponding local buses driven by the corresponding BWB circuits.

NMOS transistor N31 (constituting the word line selection switch WS) is turned on with selection signal "from rdec-1" or "from rdec-2", so that the word line WL is coupled to the low level power source Vss. To make the word line level boosted while it is unselected so as to reduce the leakage of the cell diode, and to suppress the access delay due to leakage current from a selected bit line to an unselected word line at an access time, NMOS transistor N32 with the gate driven by Vd_i is additionally disposed between Vdd and NMOS transistor N31.

Resistances and capacitances are dispersedly parasitized to the word line WL as shown in FIG. 28. In consideration of this, a mimic word line "mimic WL" (i.e., imitation word line) will be coupled to the reference resistance used in the BWB circuit for monitoring the cell state change as explained later.

Figure 29:
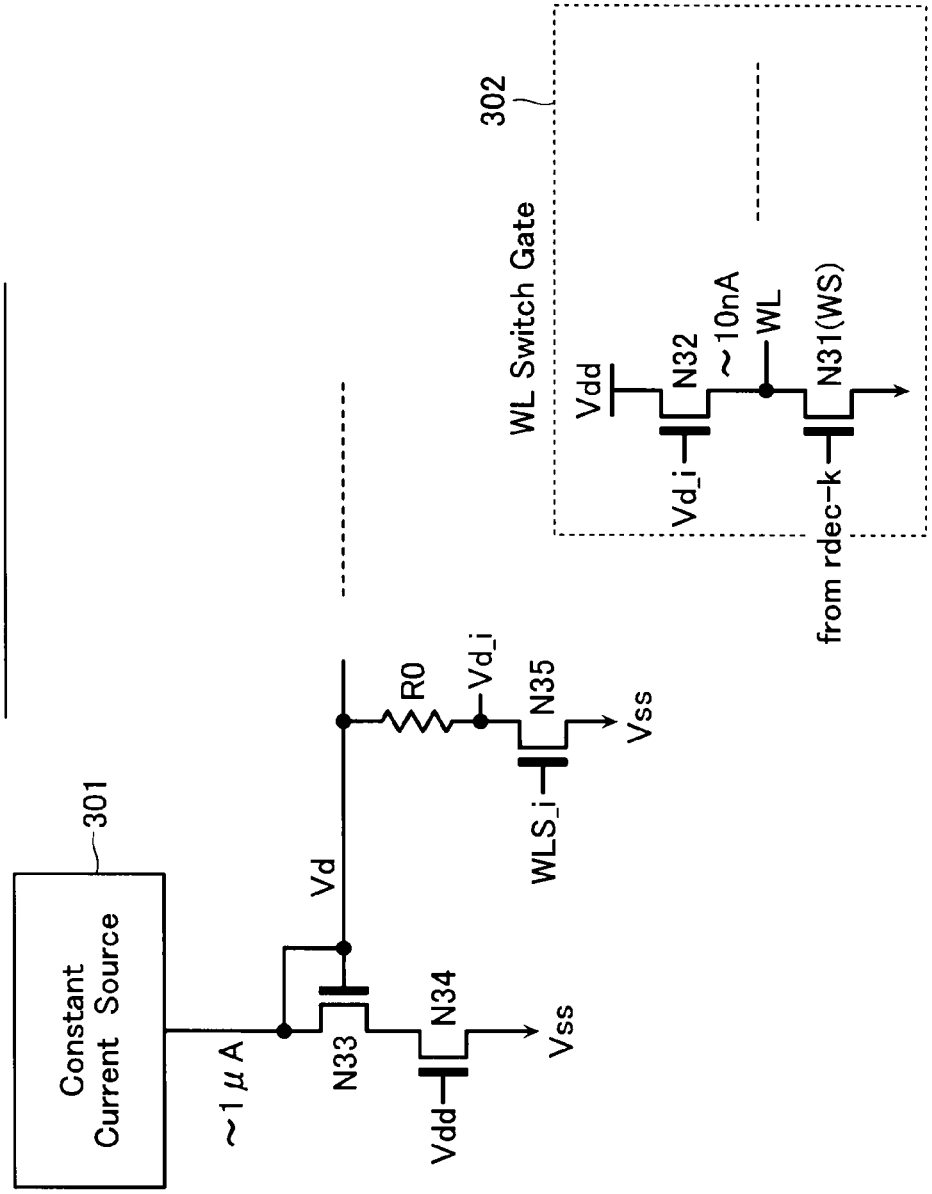
FIG. 29 shows a stationary charging circuit for word lines.

FIG. 29 shows a normal word line charge-up circuit, which is configured to generate the gate level Vd_i of the word line charging NMOS transistor N32. It is not required of the charge-up NMOS transistor N32 of each word line to carry a large current. If too large current is carried from NMOS transistor N32, it becomes a problem because it influences the word line drivability.

In consideration of the above-described situation, the word line charge-up circuit is prepared for each word line group, in which plural word lines are collected, and when a word line is selected in a word line group, Vd_i for the selected word line is lowered in level to turn off NMOS transistor N32 while the remaining NMOS transistors N32 of unselected word lines in the group are kept on.

Gate level Vd generating circuit in the word line charge-up circuit has current source 301 flowing constant current of 1 µA, and diode-connected NMOS transistor N33 for receiving the constant current. With this circuit, it will be generated the gate level Vd corresponding to the gate threshold voltage of NMOS transistor N33. This gate level Vd is applied to the gates of charge-up NMOS transistors N32 in a word line switch gate group 302.

It should be noted here that the channel width of NMOS transistor N33 is 100 times larger than that of the charge-up NMOS transistor N32. Therefore, the charge-up NMOS transistor N32 of each word line carries the maximum current of about 10 nA.

Voltage signal Vd_i for each word line is obtained from the gate level Vd via high resistance R0. Vd_i output node is coupled to Vss via NMOS transistor N35, which is driven by word line group selection signal WLS_i.

Therefore, on a selected word line, Vd_i is pulled down to Vss, and charge-up NMOS transistor N32 is turned off. By contrast, the remaining charge-up NMOS transistors N32 in the group are driven by Vd_i to be kept on, and non-selected word lines are kept in the normally charged-up state.

Figure 30:
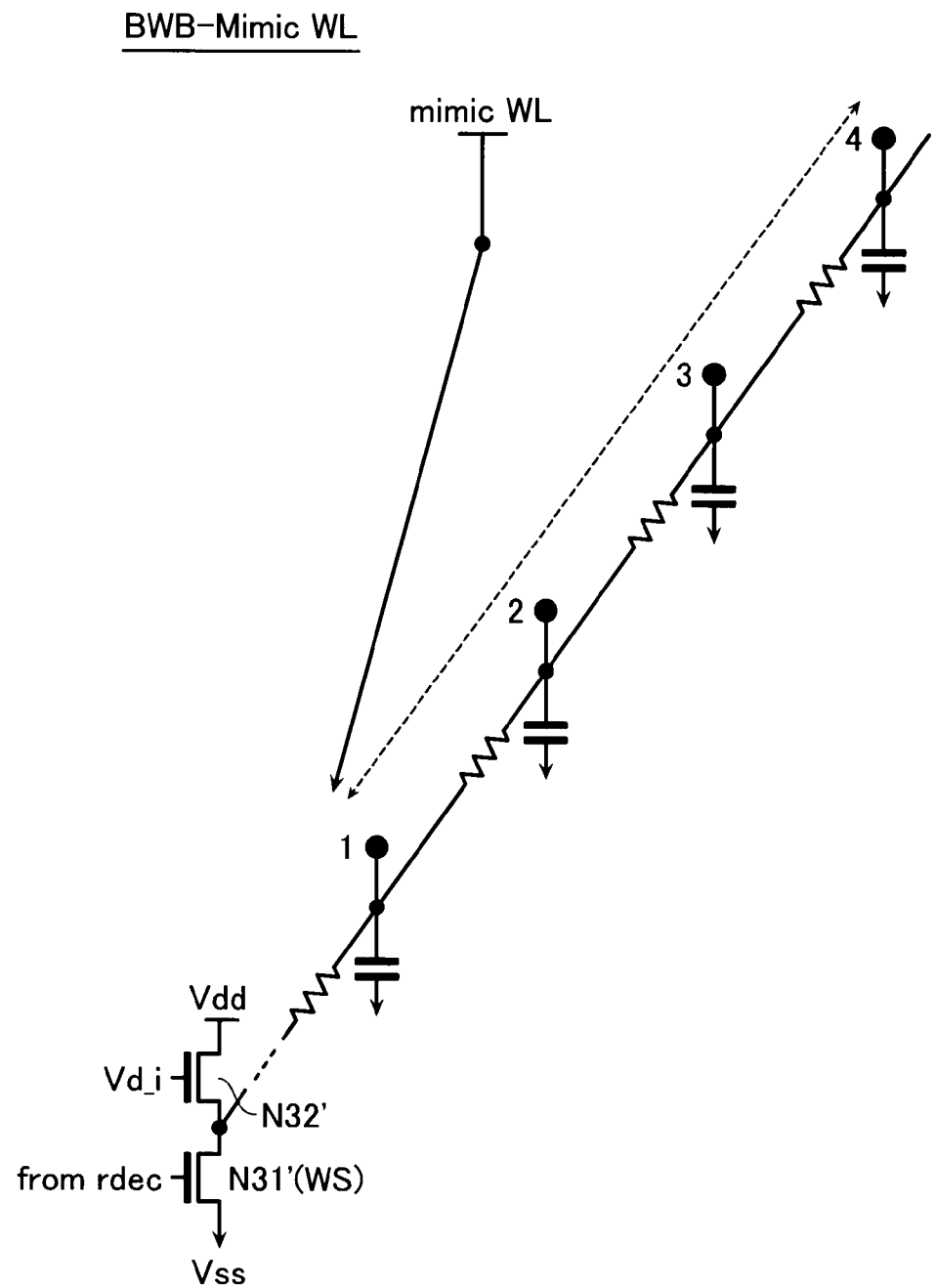
FIG. 30 shows a mimic word line used in the BWB circuit.

Resistance value of Rref, which is used in the BWB circuit used for monitoring the cell state, is exchanged in correspondence with which bit line position is accessed in the range of a long word line WL to be influenced by the word line resistance. FIG. 30 shows a mimic word line "mimic WL" used in the write buffer circuit, BWB, for exchanging the Rref value.

Mimic WL has a long wiring with substantially the same circumstances as the word line, and plural connection nodes are disposed in correspondence with the word line sections. In FIG. 30, the connection nodes are designated by number 1, 2, 3 and 4.

The connection nodes of the mimic WL are selected to be coupled to reference resistances Rref1, Rref2 in accordance with the BWB circuits used for the respective word line sections. As a result, with respect to a selected cell, the circumstances (parasitic resistance and capacitance) of the selected word line and the selected reference resistance will be made to be substantially equal to each other.

Note here in FIG. 30 that input signal "from rdec" of the switch gate NMOS transistor N31' of mimic WL is a timing signal for activating the selection signal of the word line switch gate of the cell array; and gate level Vd_i applied to the charge-up NMOS transistor N32' is the same signal as that used in FIG. 29, which becomes "L" in receipt of "from rdec".

Figure 31:
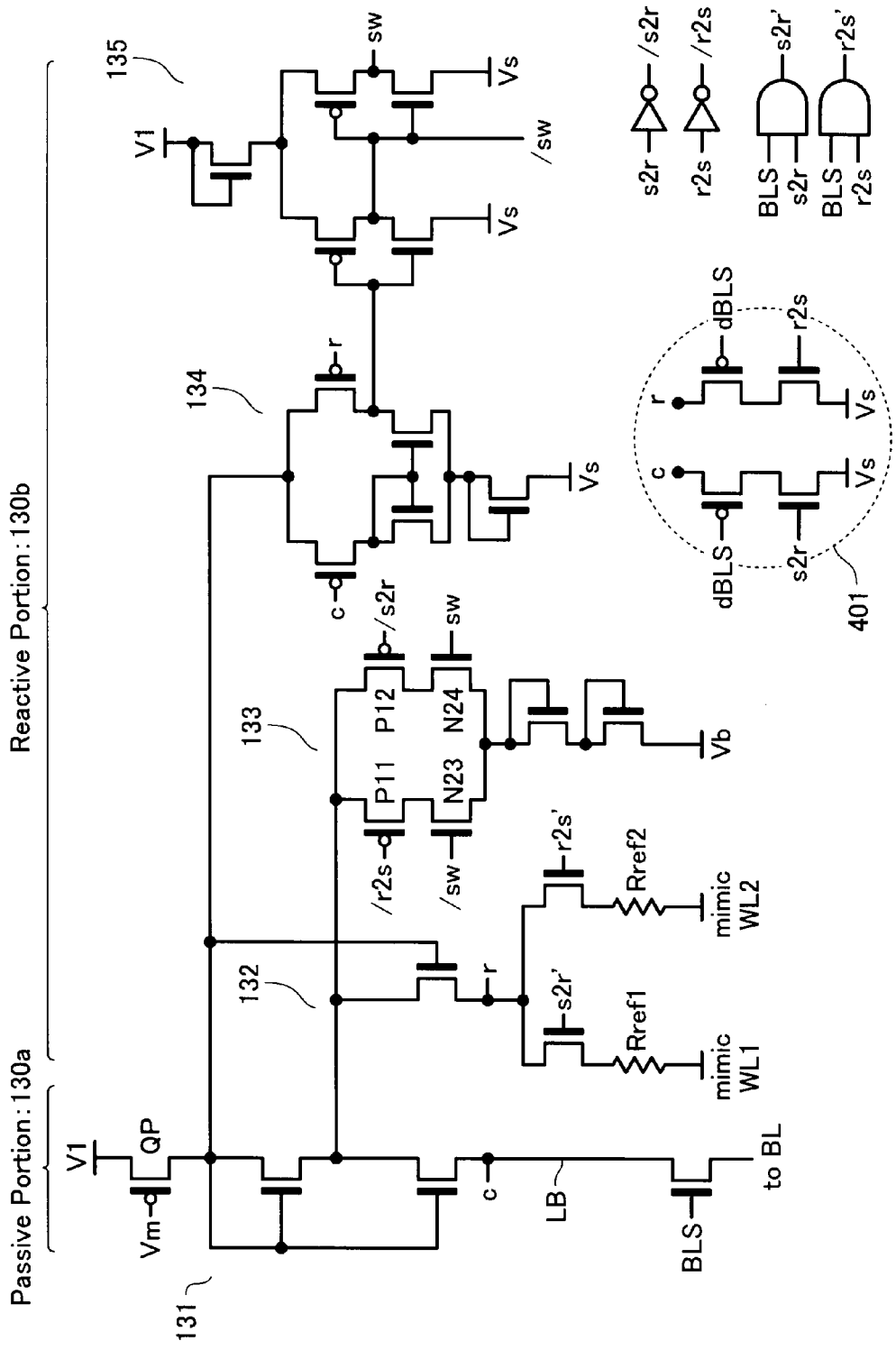
FIG. 31 is a diagram for explaining the best BWB circuit.

Next, the detailed configuration of the BWB circuit, which operates in correspondence to the word line sections, will be explained with reference to FIG. 31. The basic configuration is the same as explained above, but this BWB circuit is controlled to be adaptable to various parasitic resistances and capacitances.

First, there are attached various parasitic resistances to local bus LB, to which the BWB circuit is coupled, and bit line BL coupled to it. Therefore, it is impossible to start up the BWB circuit soon just after accessing. It is required of the BWB circuit to be set in a stable initial state for precisely monitoring the cell state change.

For this purpose, monitor nodes "c" and "r" are set in an initial level to be expected in the BWB circuit after the local bus LB is coupled to bit line BL with selection start signal BLS, and before starting-up the BWB circuit. So, there is prepared initializing circuit 401 for setting the node "c" (i.e., local bus LB itself) or node "r" to be low power source voltage Vs for a while before and after the local bus LB is coupled to the bit line BL in accordance with write modes.

Explaining in detail, initializing circuit 401 sets the level of (1) node "c" on the cell side of the local bus in "set to reset" mode, and (2) node "r" on the reference cell side in "reset to set" mode in accordance with signal dBLS that is raised later than the selection start signal BLS. Why the initializing is required without regard to the parasitic resistance is as follows: the selected cell to be written on a selected bit line is in the low resistance state in the "set to reset" mode, and node "c" is to be initially set in a low level; and the selected cell to be written on a selected bit line is in the high resistance state in the "reset to set" mode, and node "r" is to be initially set lower than node "c".

To be exchanged in the setting conditions in the BWB circuit in accordance with the word line sections are: gate level Vm of PMOS transistor QP serving as a current regulating device in the write buffer 131; transistor size; and resistance values of Rref1 and Rref2 serving for deciding the voltage of node "r" in the reference cell circuit 132.

Rref1 is used in the "set to reset" mode (i.e., reset-write mode) while Rref2 is used in the "reset to set" mode (i.e., set-write mode). Therefore, these are set in optimum values in accordance with the respective write modes and word line resistance sections.

Further, there are prepared selection signals "s2r'" and "r2s'" generated by AND logic between mode selection signals "s2r", "r2s" and bit line selection signal BLS, respectively. These selection signals serve for controlling the switches disposed between the respective connection nodes 1-4 and the "mimic WL" terminal shown in FIG. 30 at the same time as the bit line selection switch BS.

With respect to the current bypass 133, it is effective to exchange the sizes of switch transistors P11, P12, N23 and N24 for adjusting the bypass current. As a result, it becomes possible to achieve an optimum operation condition and reduce the power consumption. However, what is most essential with respect to the BWB sectional operation is the power source property of the write buffer 131 exchanged by adjusting the size of PMOS transistor QP serving as the current regulating device and gate level Vm thereof.

Figure 32:
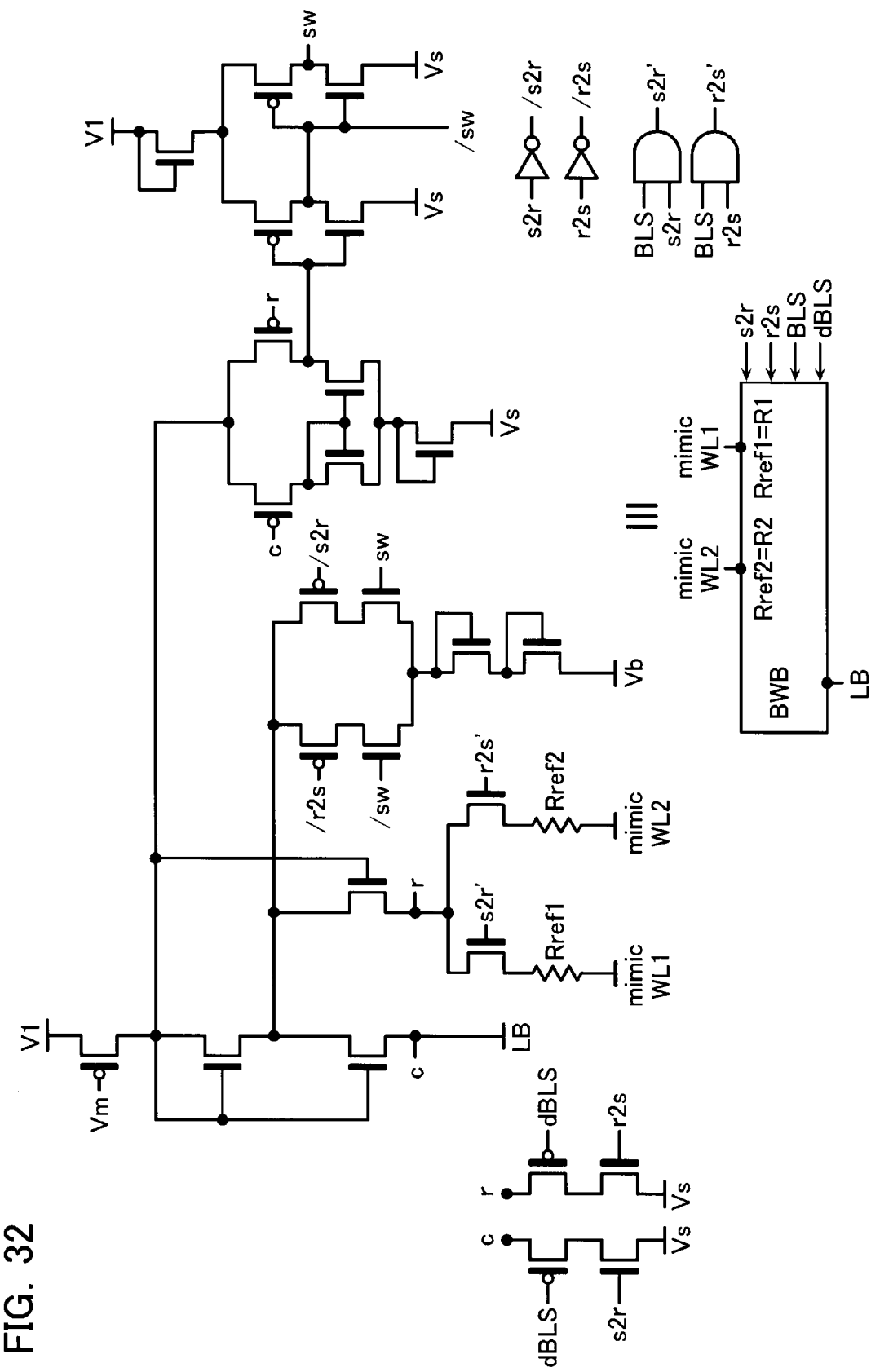
FIG. 32 shows the configuration of the BWB circuit and the circuit symbol.

FIG. 32 shows the above described BWB circuit and symbolization thereof for the convenience of the successive explanations. As shown in FIG. 32, output nodes of BWB are two mimic word lines, mimic WL1 and mimic WL2, and local bus LB while input signals are "s2r'", "r2s'", "BLS" and "dBLS". The power source is omitted here.

The resistance values of Rref1 and Rref2 are exchanged respectively in accordance with circumstances. These resistance values "R1" and "R2" are shown in the circuit block as reference examples. Although there are some other transistor sizes, which may be exchanged in accordance with circumstances, the detailed explanation is omitted here because detailed designs thereof are dependent on the transistor properties.

Figure 33:
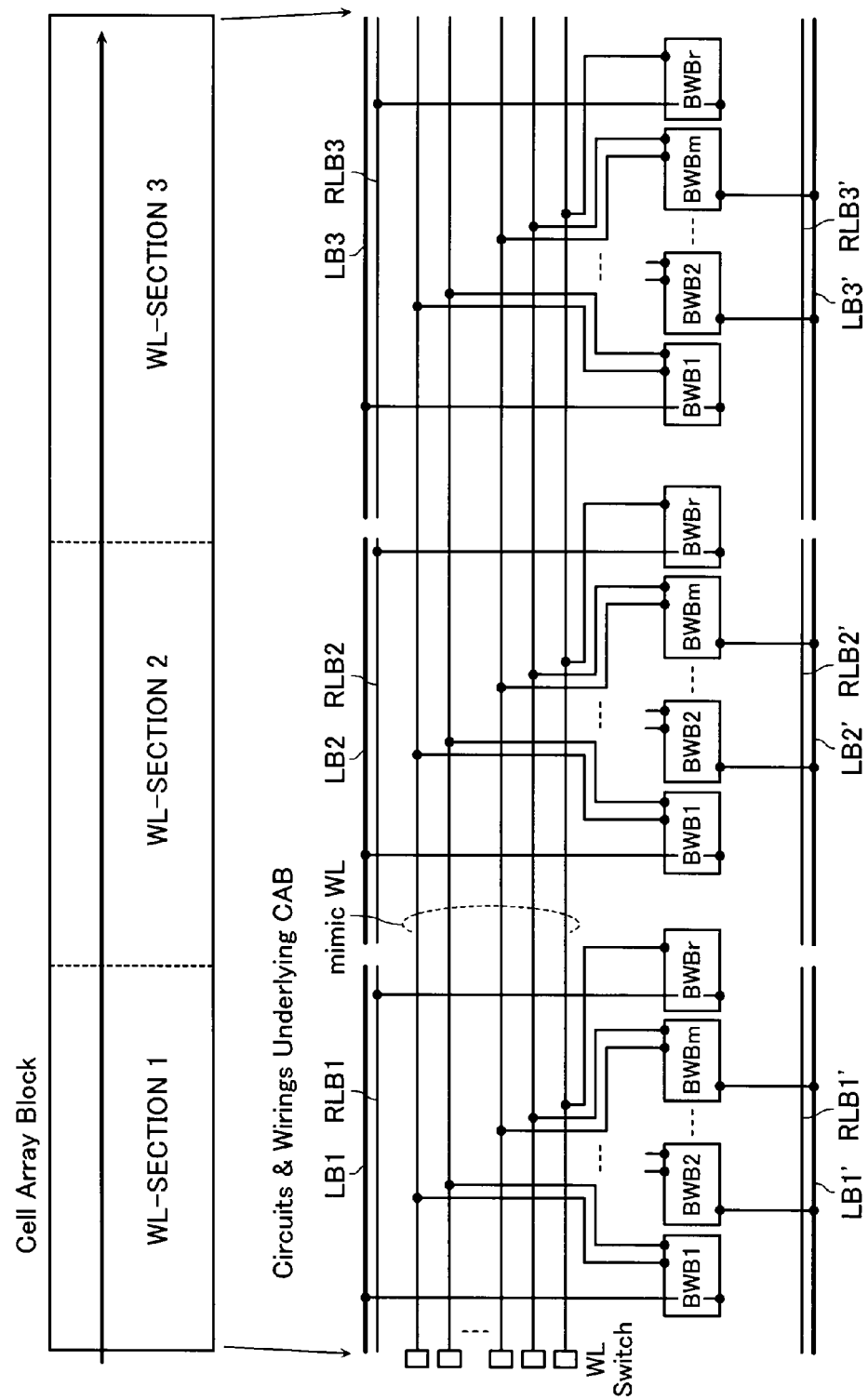
FIG. 33 shows a layout of mimic word lines, local buses and BWBs in a case where word line terminals are arranged on one end of the cell array.

FIG. 33 shows an example of the word line sections and the BWB arrangement in such a case that all word lines in the cell array block are driven from one end thereof. Here is shown a case where the cell array block is divided into three word line sections, WL-SECTION1~WL-SECTION3, in the word line direction.

Bit lines BL of the cell array block are derived alternately from both ends thereof. Therefore, local buses LBi and LBi' (i=1 to 3) formed on the semiconductor substrate underlying the cell array block are disposed in such a manner that these correspond to the both ends of bit lines BL, respectively. To drive these local buses, BWB circuits are arranged in correspondence with the respective local buses LBi and LBi'. Bit lines BL are selectively coupled to the local buses LBi, LBi', and read/write of cells is performed.

Reference local buses RLBi, RLBi' are disposed for reference bit lines RBL. The reference bit line RBL is used in a cell data read mode, and it has no relation to the word line sections in this mode. However, it is required of the reference cells on the reference bit line RBL to be written into the low resistance state, so that write modes in accordance with the word line sections are adapted to the reference bit lines RBL.

It should be noted here that: in a case, there are multiple reference bit lines in a word line section; and in another case, there is not a reference bit line in a word line section. If there is not a reference bit line in a word line section, the reference local bus prepared in the adjacent word line section will be used. In the example shown in FIG. 33, reference local buses RLBi and RLBi' are disposed in correspondence with the respective word line sections.

In this example, word lines WL are driven from one end of the cell array block. Therefore, mimic word lines "mimic WL" are disposed in such a manner as to be elongated from one end of the cell array block to the other end and coupled to word line switches disposed on the one end as similar to the word lines WL. The number of the mimic word lines is equal to twice the number of simultaneously written bit lines plus the number of reference bit lines simultaneously written together with the bit lines.

BWB circuits are disposed in each word line section with the same number as that of the simultaneously written bit lines.

In a write mode, write data is transferred to BWB circuits on a word line section, in which bit lines are written simultaneously in parallel, and mimic word lines are coupled in these BWB circuits in correspondence with the position, so that the reference resistances are set in the respective conditions suitable for monitoring the write states of the selected cells.

Figure 34:
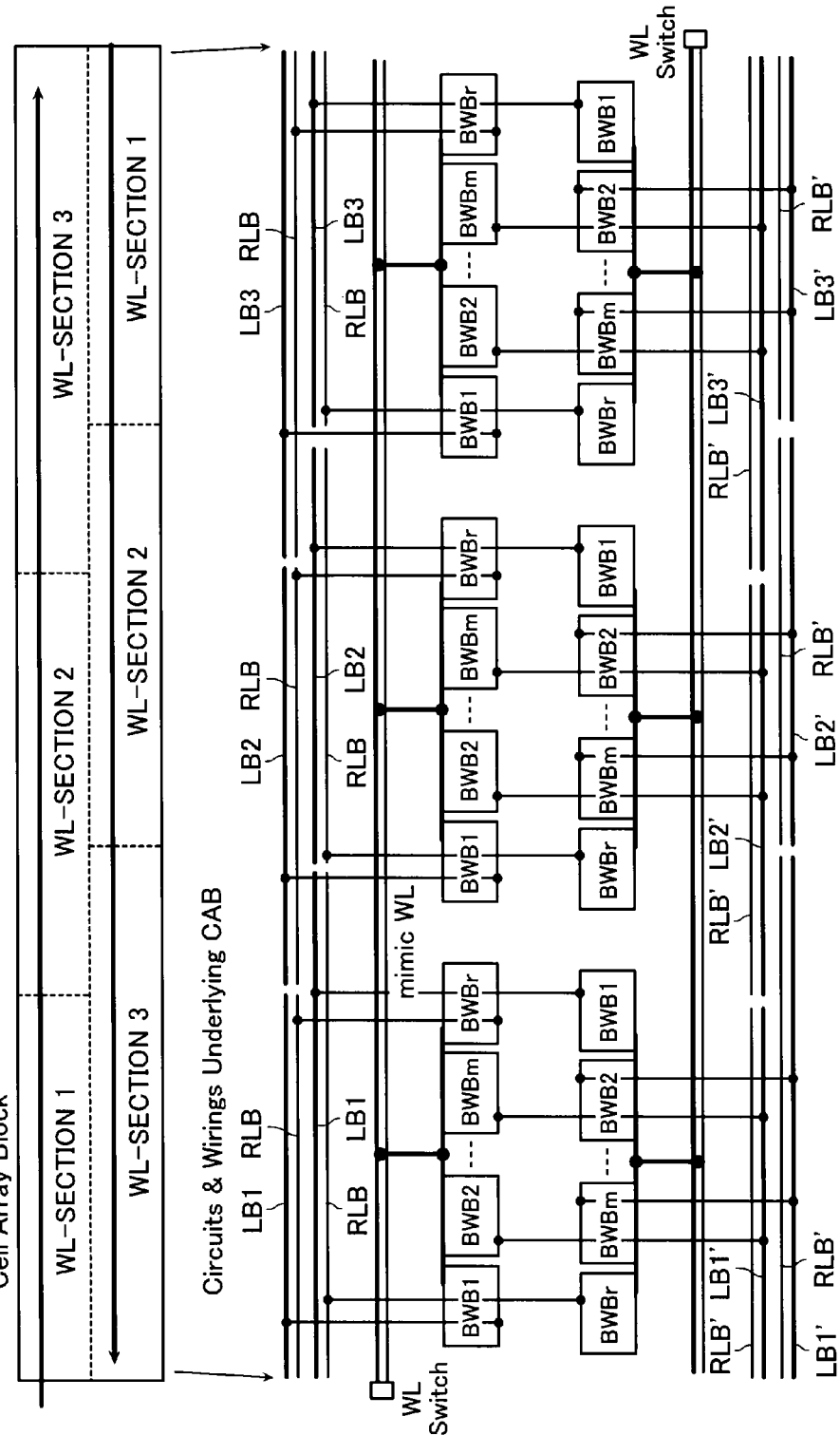
FIG. 34 shows another layout of mimic word lines, local buses and BWBs in another case where word line terminals are arranged alternately on the both ends of the cell array.

FIG. 34 shows another example of the word line sections and the BWB arrangement in a case that word lines in the cell array block are alternately driven from the both ends as similar to bit lines.

In case word lines WL are driven alternately from the both sides, a word line section, to which a selected bit line on a fixed position of the cell array belongs, is defined in accordance with whether a selected word line is driven from the left end or the right end. If word line sections become different, setting conditions of the BWB circuits become different. Therefore, it is in need of preparing two kinds of BWB circuits for a bit line to be selectively used in accordance with word lines to be driven from the left side and those to be driven from the right side.

Although, in the example shown in FIG. 34, it is shown as if the cell array block is divided into two areas defined by left-side driving and right-side driving word line sections, word line sections are exchanged for every word line in practice. Further, since left-side driving word line sections and right-side driving word line sections are complicatedly overlapped and arranged, it is required of mimic WLs, BWBs and LBs to be disposed in correspondence with the left-side driving and right-side driving, respectively. Therefore, it is necessary to dispose twice elements in comparison with those shown in FIG. 33.

Next, it will be explained simulation results of the cell write operations in relation to the word line sections, to which detailed resistance values are assigned.

Figure 35:
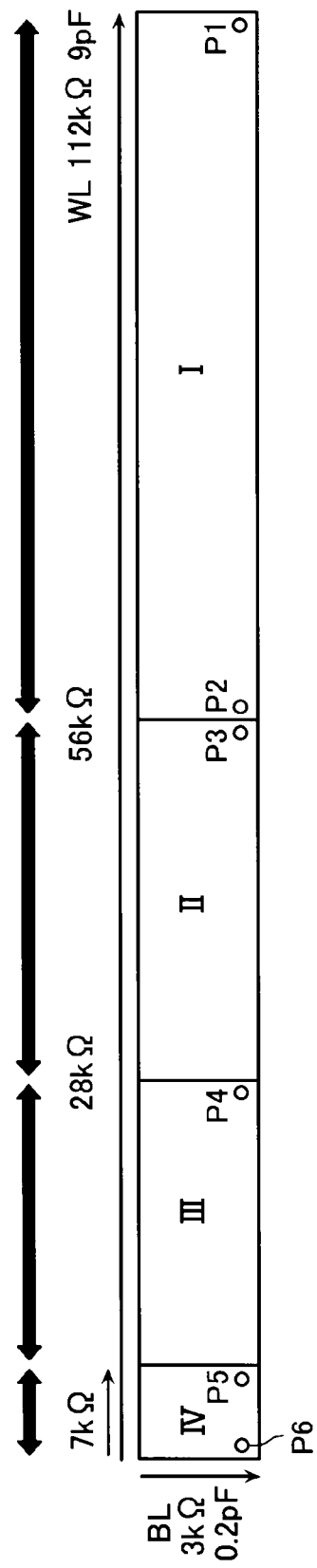
FIG. 35 shows a word line section on a simulation for verifying the effect of BWB circuit.

As shown in FIG. 35, word line sections I, II, III and IV are defined on a long word line WL for examining the effect of BWB, and data write operations are simulated at cell positions P1 to P6 with relation to the word line sections. It is supposed here that bit line resistance is 3 k$\Omega$, and bit line capacitance is 0.2 pF, and a cell disposed farthest from the bit line selection switch is selected.

Explaining in detail, word line sections I to IV are defined as follows: I=56 k$\Omega$~112 k$\Omega$; II=28 k$\Omega$~56 k$\Omega$; III=7 k$\Omega$~28 k$\Omega$; and IV=0~7 k$\Omega$. The total capacitance of the word line is 9 pF.

The reason of that as the word line resistance becomes larger, the corresponding word line section region becomes wider, is in a fact that as the word line resistance becomes larger, change rate thereof becomes smaller. Explaining in other words, as the word line section becomes wider, it becomes unnecessary to finely exchange the parameter of the BWB.

Figure 36:
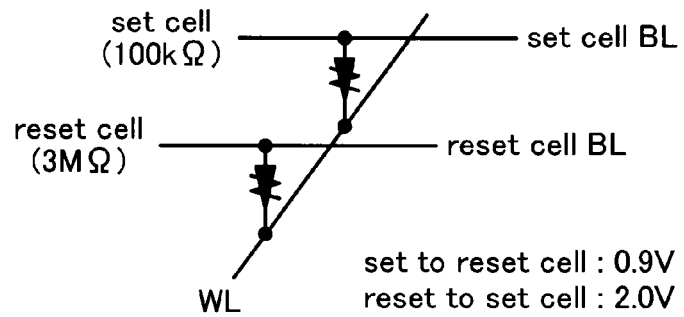
FIG. 36 shows cell conditions of the simultaneously written cells used on the simulation.
Figure 37:
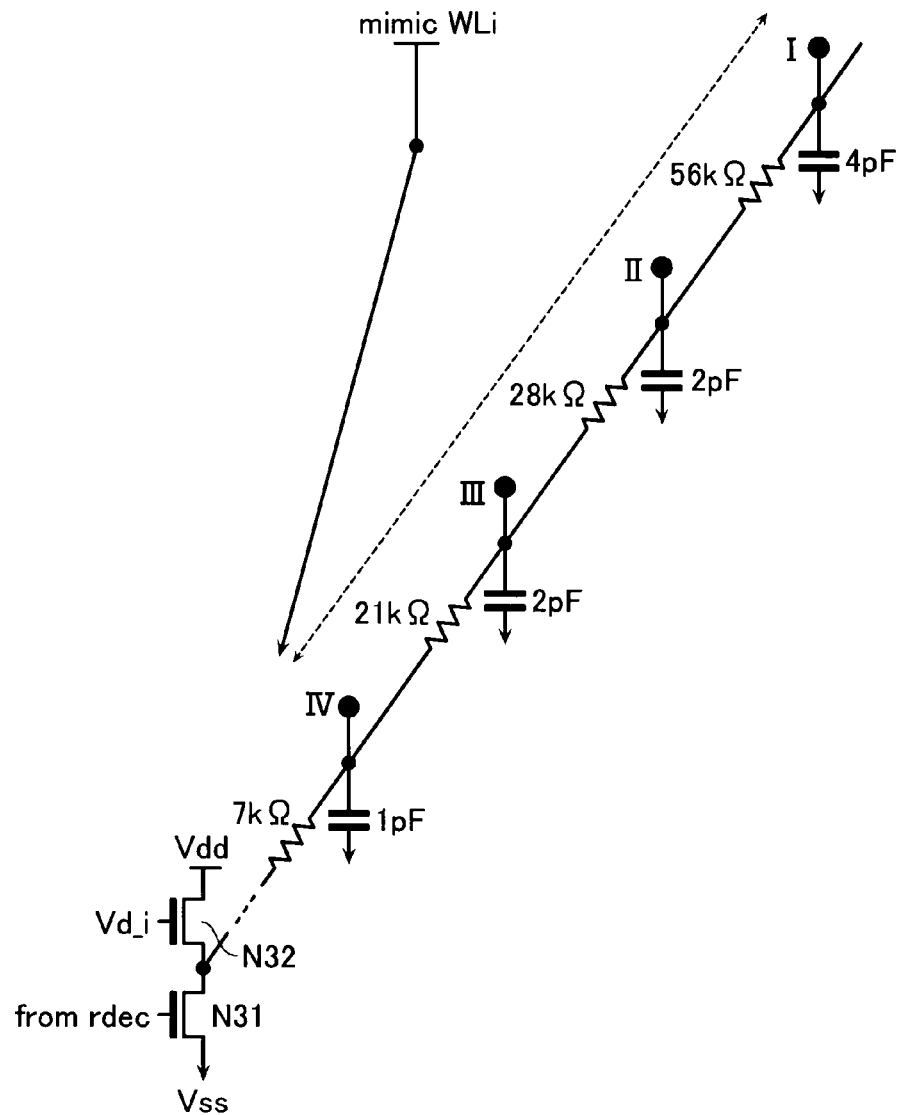
FIG. 37 shows the sections of word line and mimic word line used in the simulation.
Figure 38:
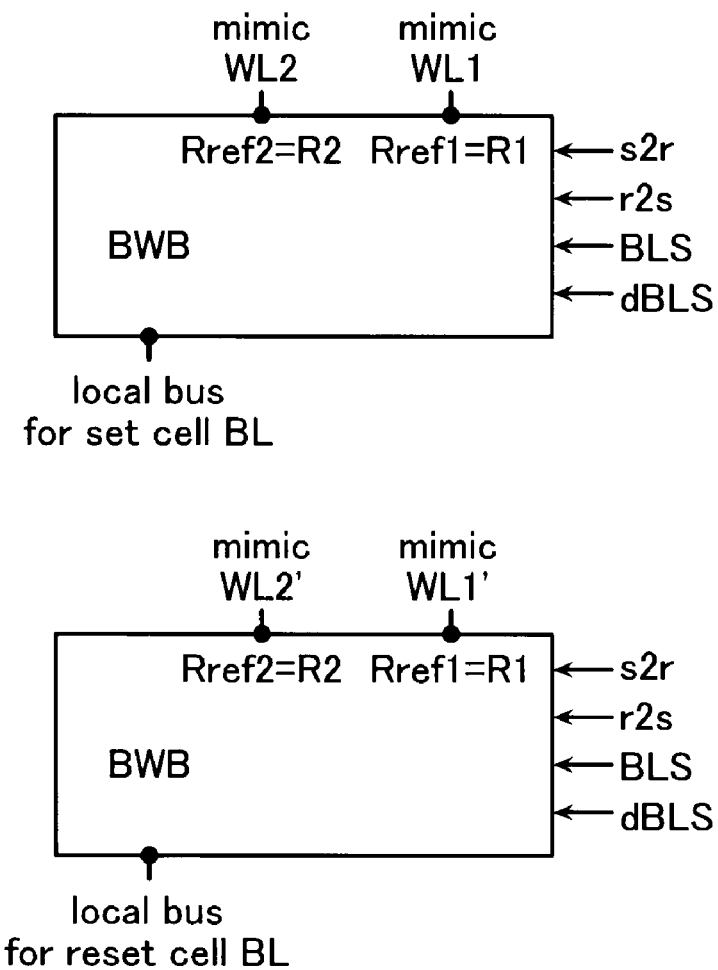
FIG. 38 shows an example of the reference resistance in BWB used in the simulation.

FIGS. 36 to 38 show the outlines of the circuit systems used for examining the effect of the BWB.

As shown in FIG. 36, on the assumption that a set cell (in the low resistance state) and a reset cell (in the high resistance state) are disposed adjacent to each other and coupled to bit lines BL, which are simultaneously written, it will be confirmed that when one cell is changed in the state in a simultaneous set-write or a simultaneous reset-write mode, the state of the other cell is kept as it is.

The ReRAM cell model used here is as follows: transition voltage of "set to reset" cell (i.e., cell changed from the set state to the reset state) is 0.9 V; transition voltage of "reset to set" cell (i.e., cell changed from the reset state to the set state) is 2.0 V; the resistance of the set state is 100 k$\Omega$; and the resistance of the reset state is 3 M$\Omega$.

As shown in FIG. 37, word line end is coupled to nodes I~PV, which are modeled word line sections, in correspondence with the above-described word line sections. Similarly coupled to the BWB are mimic word line nodes I~IV of modeled mimic WL1, 1' and mimic WL2, 2' in correspondence with the word line sections. That is, there are five word line models such as: one word line WL and four mimic word lines.

As shown in FIG. 38, there are prepared two BWBs, i.e., set cell-use BWB and reset cell-use BWB. Terminals thereof are exchanged in correspondence with the word line sections, the reference resistance values are set as follows: R1=70 k$\Omega$, R2=1220 k$\Omega$ in the word line section I; R1=140 k$\Omega$, R2=620 k$\Omega$ in the word line section II; R1=180 k$\Omega$, R2=740 k$\Omega$ in the word line section III; and R1=260 k$\Omega$, R2=920 k$\Omega$ in the word line section N. This is only an example, other suitable values may be used in the practical system.

FIGS. 39 to 50 show the waveforms of the simulation results designating that the cell state change has been preformed out of the problem. In these drawings, the lateral axis is "time" shown by the second; the left side vertical axis is "potential level" shown by the voltage; and the right side vertical axis is "current level" shown by the ampere.

Figure 39:
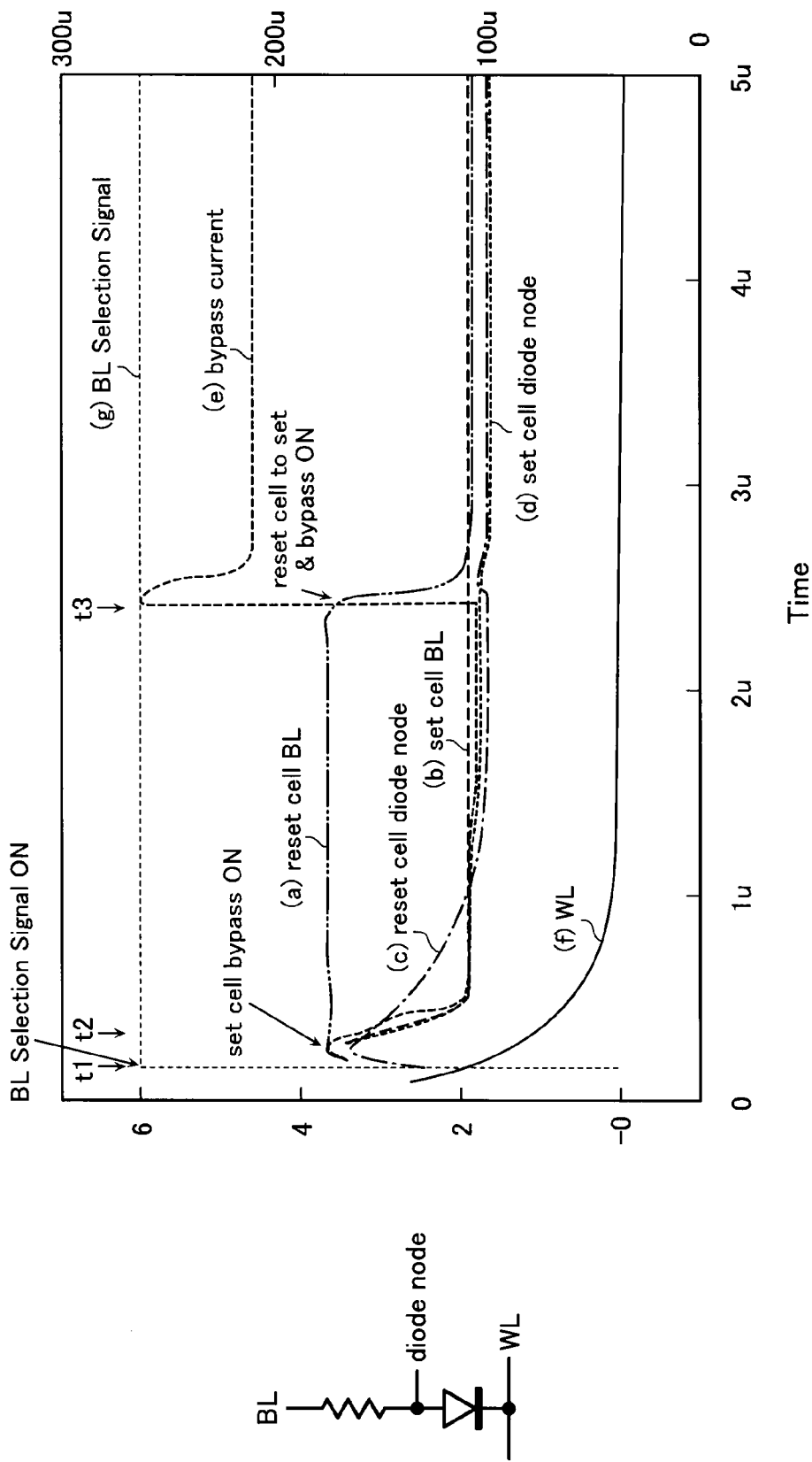
FIG. 39 shows the set program simulation result at cell position P1 in word line section I.

FIG. 39 shows a set-write simulation result at the cell position P1 in the word line section I (i.e., at 112 k$\Omega$ position on 112 k$\Omega$ word line). As shown by (g) BL selection signal curve, the bit line selection signal is raised to 6V (timing t1), whereby write voltage and current are supplied to the bit line. As a result, the bit line, to which a reset cell is coupled, becomes about 4V, as shown by (a) reset cell BL curve.

By contrast, with respect to a set cell, the bypass circuit in BWB is activated (timing t2), and about 100 $\mu$A current flows, whereby the corresponding bit line is set to be 2V or lower as shown by (b) set cell BL curve.

There are shown in the drawing both of (c) reset cell diode node curve and (d) set cell diode node curve. As apparent from the differences between the bit line voltage and these node potentials, about 2V is applied to the reset cell while the set cell is not applied with voltage. Word line level is, as shown by (f) wl curve, gradually lowered. However, the cell node on the word line side is boosted to about 2V higher than the word line due to the voltage drop in the cell diode.

When the reset sell is changed to the set state and lowered in resistance at about 2.5 $\mu$s (timing t3), the bit line level is lowered and the bypass circuit is turned on at about the same time, whereby about 200 $\mu$A current flows, as shown by (e) bypass current curve. It will be understood that voltage is little applied to the set state cell due to the bypass current.

Figure 40:
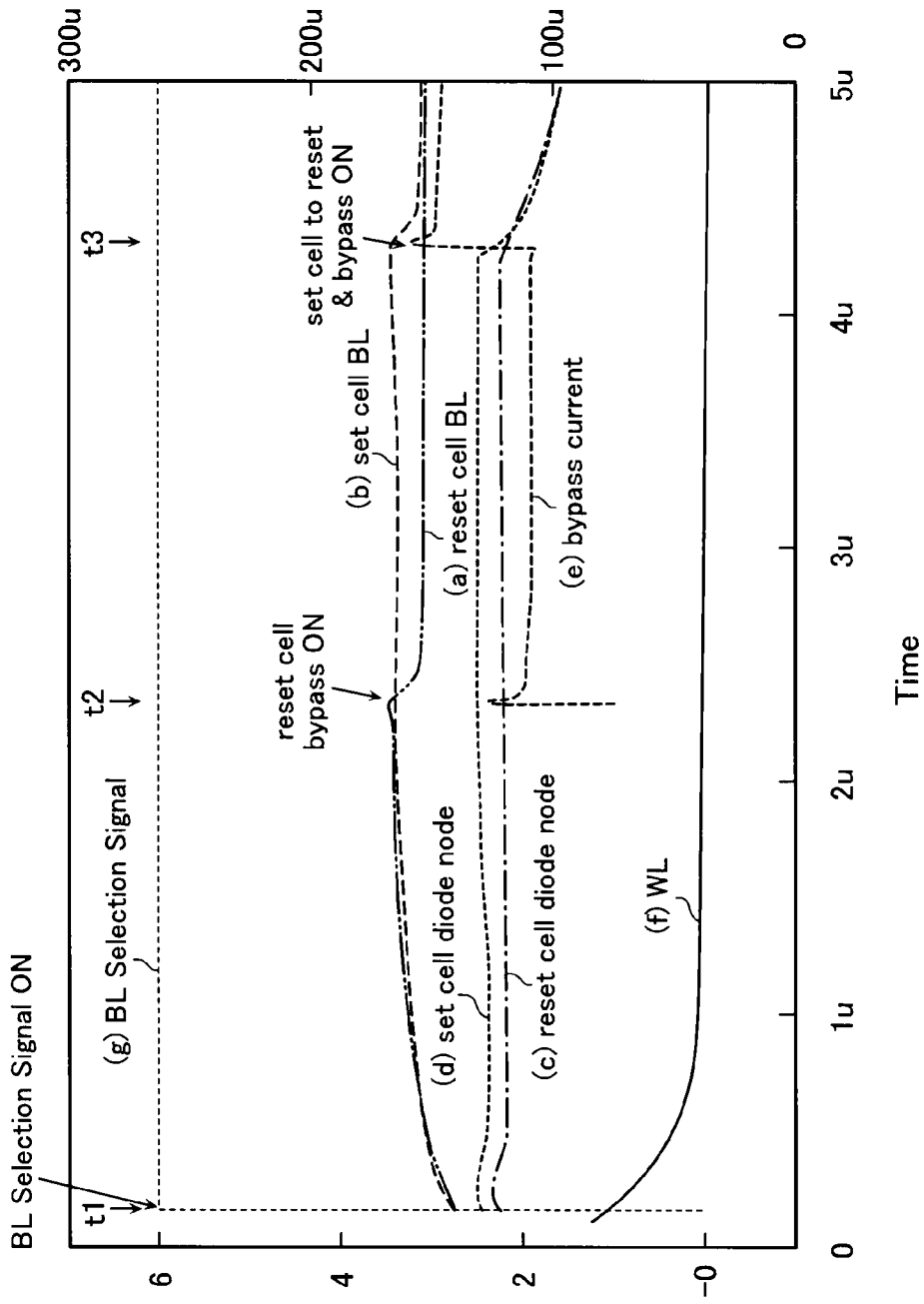
FIG. 40 shows the reset program simulation result at cell position P1 in word line section I.

FIG. 40 shows a reset-write simulation result at the same cell position P1. As shown by (g) BL selection signal curve, it is raised to 6V (timing t1), and write voltage and current are supplied to the bit lines, so that these bit lines are boosted to about 3.5V as shown by (a) reset cell BL curve and (b) set cell BL curve.

(d) Set cell diode node is a little higher than (c) reset cell diode node because current flows in the former, and at about 2.5V of them, cells are applied with about 1V.

Bypass current circuit on the reset cell side is activated at about 2.4 $\mu$s (timing t2). As a result, (e) bypass current of about 100 $\mu$A flows, and (a) reset cell BL level is lowered, whereby the reset cell voltage is further lowered. Therefore, the reset cell is not changed in state gain.

When the set cell is changed to be in the reset state with a high resistance at about 4.3 μs, the bypass circuit is turned on (timing t3), and (e) bypass current of about 150 μA flows, whereby (b) set cell BL is lowered in level. This prevents the reset cell from being applied with an extremely high voltage. That is, the cell is not applied with a state changeable voltage again after the state transition.

Figure 41:
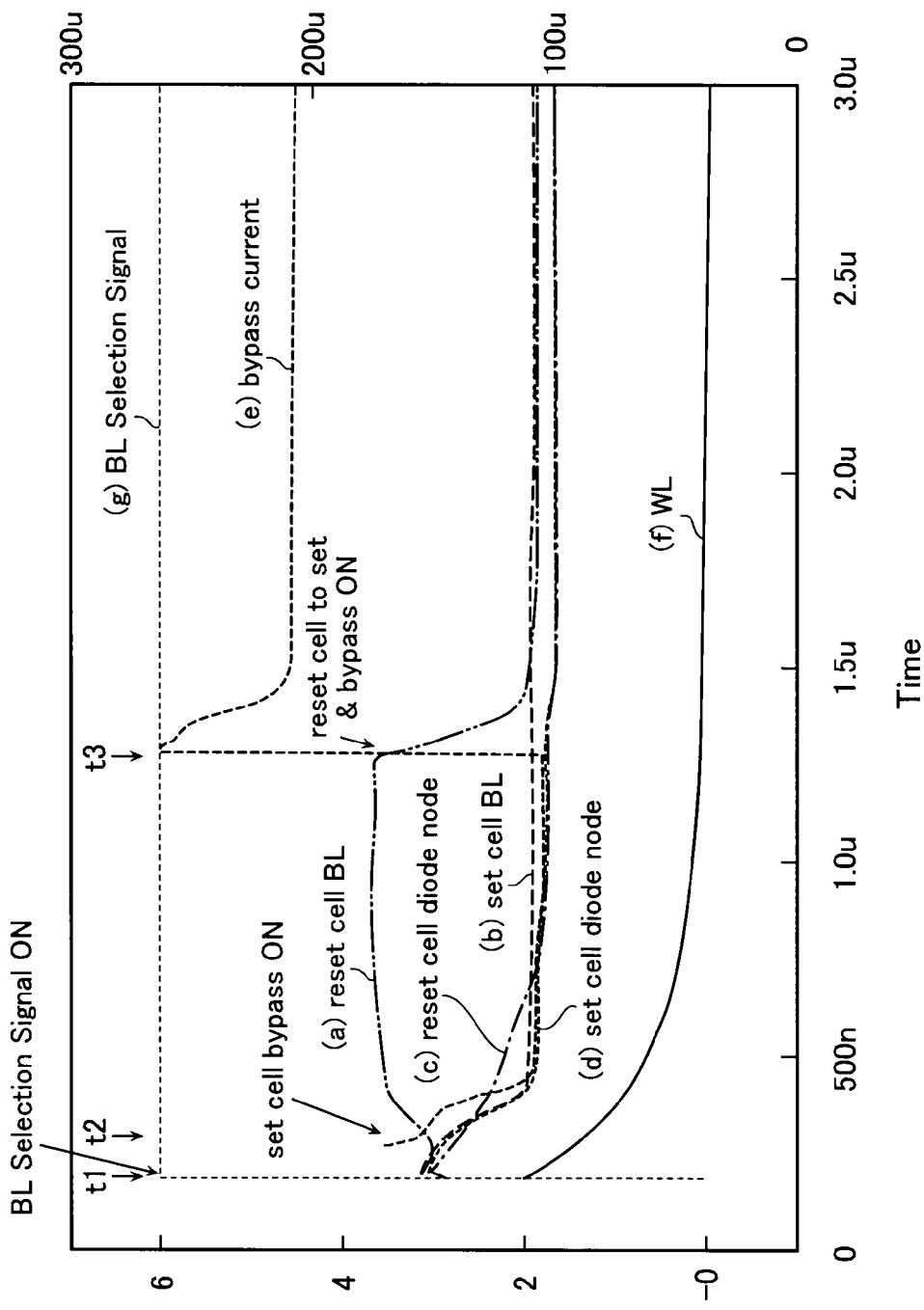
FIG. 41 shows the set program simulation result at cell position P2 in word line section I.

FIG. 41 shows a set-write simulation result at the cell position P2 in the word line section I (i.e., at 56 kΩ position on 112 kΩ word line).

Although the change situations of the respective nodes are about the same as those at the cell position P1 shown in FIG. 39, the reset cell's state change starts at about 1.3 μs (timing t3). This is 1 μs or more earlier than the case shown in FIG. 39. This is because that the cell voltage is applied early as a result of the voltage drop due to the word line resistance.

Figure 42:
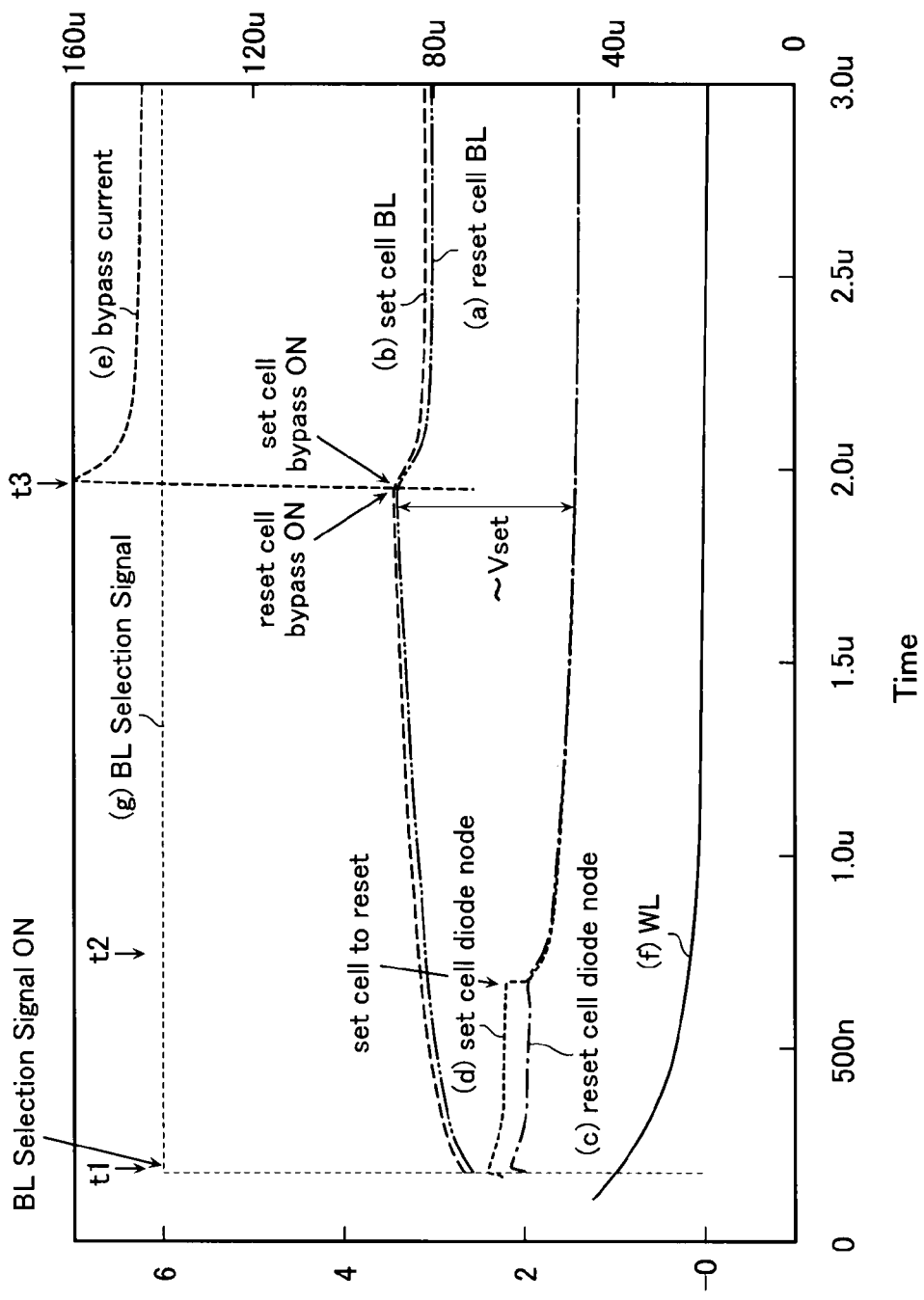
FIG. 42 shows the reset program simulation result at cell position P2 in word line section I.

FIG. 42 shows a reset-write simulation result at the same cell position P2. The change situations of the respective nodes are about the same as those at the cell position P1 shown in FIG. 40. However, in this reset cell's state change at the position P2, when (g) BL selection signal is raised to 6V, and write voltage and current are supplied to the bit line (timing t1), (a) reset cell BL and (b) set cell BL are boosted gradually to about the same 3.5V level.

Although (d) set cell diode node is a little higher than (c) reset cell diode node because of current flows in the former, at about 2.5V, cells are applied with about 1V.

The set cell is changed to the reset state at about 700 ns (timing t2), so that (d) set cell diode node becomes about 2V as equal to (c) reset cell diode node, and then it will be gradually lowered.

Voltage applied to the reset cell becomes larger gradually. When it becomes about the set voltage Vset at about 2 μs, reset cell-use and set cell-use bypass circuits in the BWB are turned on simultaneously (timing t3), and (e) bypass current of about 140 μA flows. As a result, the bit line level is lowered, and the reset cell's voltage is lowered to be under Vset. Therefore, the reset cell is not changed to the set state again. However, the cell voltage is near the limit of Vset. Therefore, it will be confirmed that it is difficult to keep this word line section more.

Figure 43:
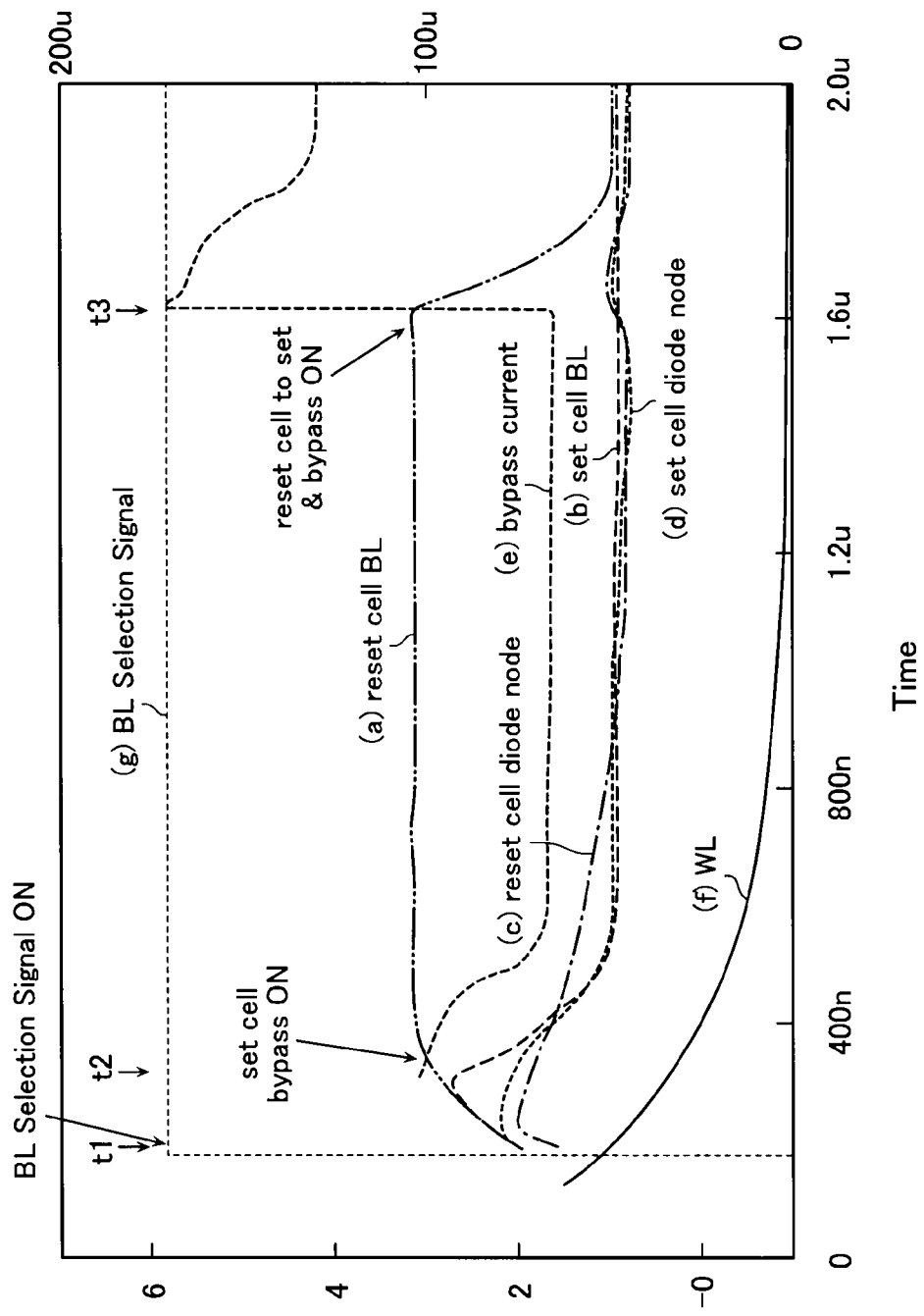
FIG. 43 shows the set program simulation result at cell position P3 in word line section II.

FIG. 43 shows a set-write simulation result at the cell position P3 in word line section II (i.e., at 56 kΩ position on 56 kΩ word line).

The change situations of the respective nodes are about the same as those at the cell position P1 shown in FIG. 39. The reset cell's state change occurs at about 1.6 μs (timing t3). It is about 1 μs earlier than that shown in FIG. 39, but it is delayed to that in the case at the cell position P2 shown in FIG. 41. This is because of that the cell voltage is applied soon in accordance with the voltage drop due to the word line resistance; and mimic WL current from the power source is increased due to mimic WL resistance reduction, and bit line voltage becomes lower than the case of adjacent cell position P2.

Figure 44:
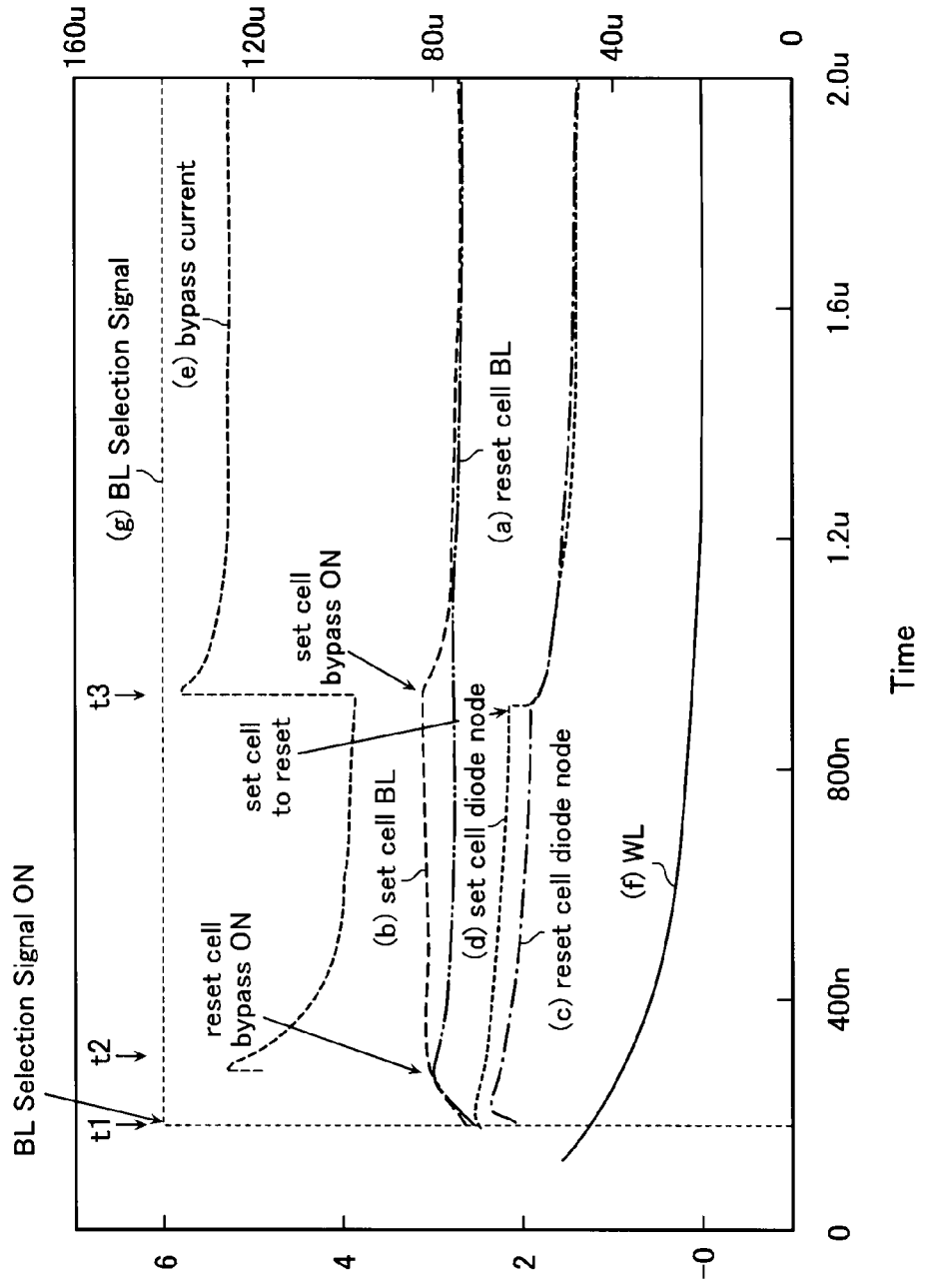
FIG. 44 shows the reset program simulation result at cell position P3 in word line section II.

FIG. 44 shows a reset-write simulation result at the same position P3.

The change situations of the respective nodes are about the same as those in the case of the cell position P1. Set state cell's state change occurs at about 1 μs (timing t3). It is more than 3 μs earlier than that shown in FIG. 40. This is because of that the cell voltage is applied soon in accordance with the voltage drop reduction due to the word line resistance.

The bypass circuit for the reset cell is turned on at timing t2 just after the bit line connection with the (g) BL selection signal (timing t1). This is more than 2 μs earlier than the case shown in FIG. 40. This is because that the potential changes of the respective nodes become early due to the word line resistance reduction.

Figure 45:
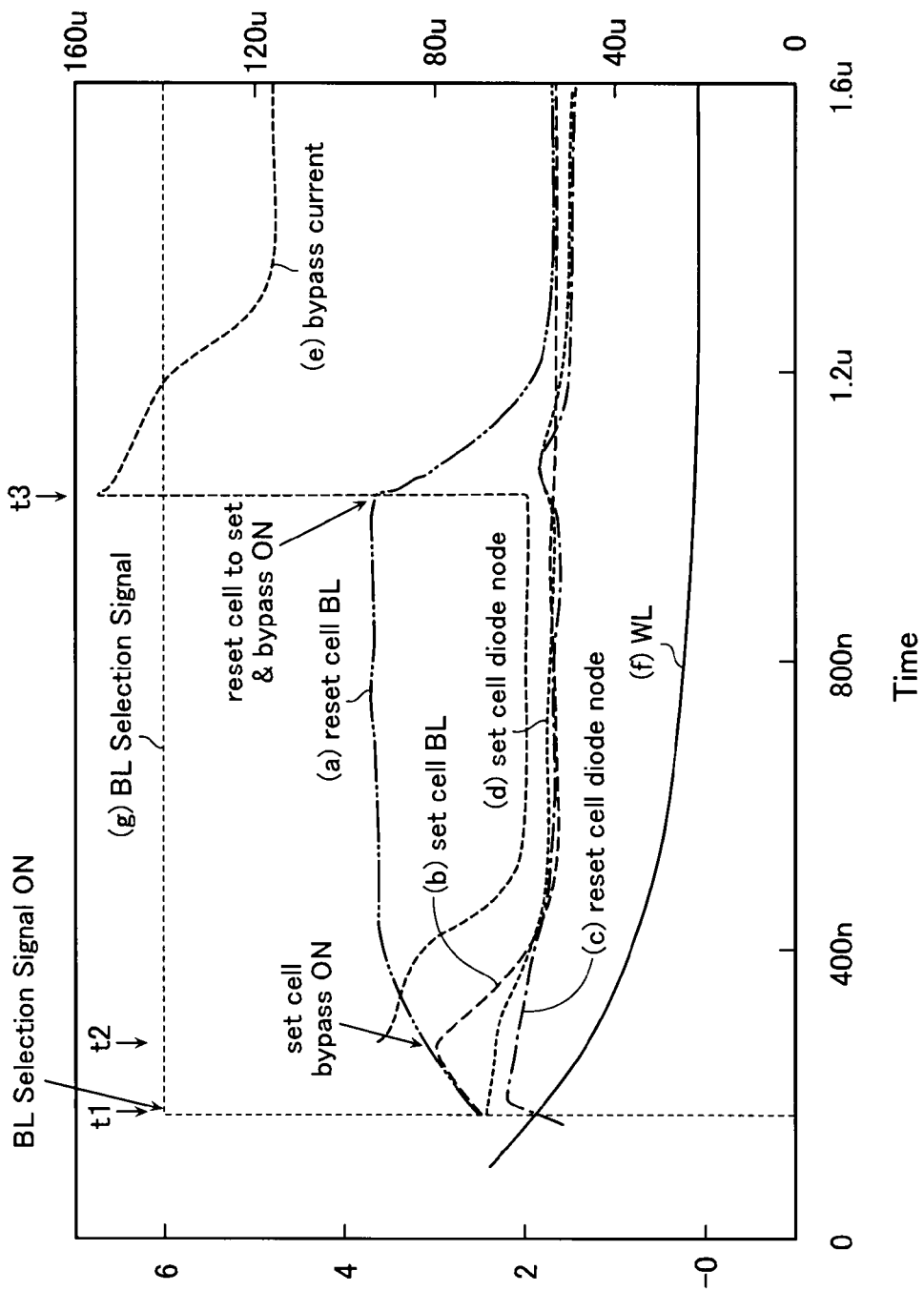
FIG. 45 shows the set program simulation result at cell position P4 in word line section III.

FIG. 45 shows a set-write simulation result at the cell position P4 in the word line section III (i.e., at 28 kΩ position on 28 kΩ word line).

The change situations of the respective nodes are about the same as those in the case of the cell position P1. The state change of the reset cell occurs at about 1 μs (timing t3). It is about 1.5 μs earlier than the case shown in FIG. 39. This is because of that the cell voltage is applied soon in accordance with the voltage drop reduction due to the word line resistance.

Figure 46:
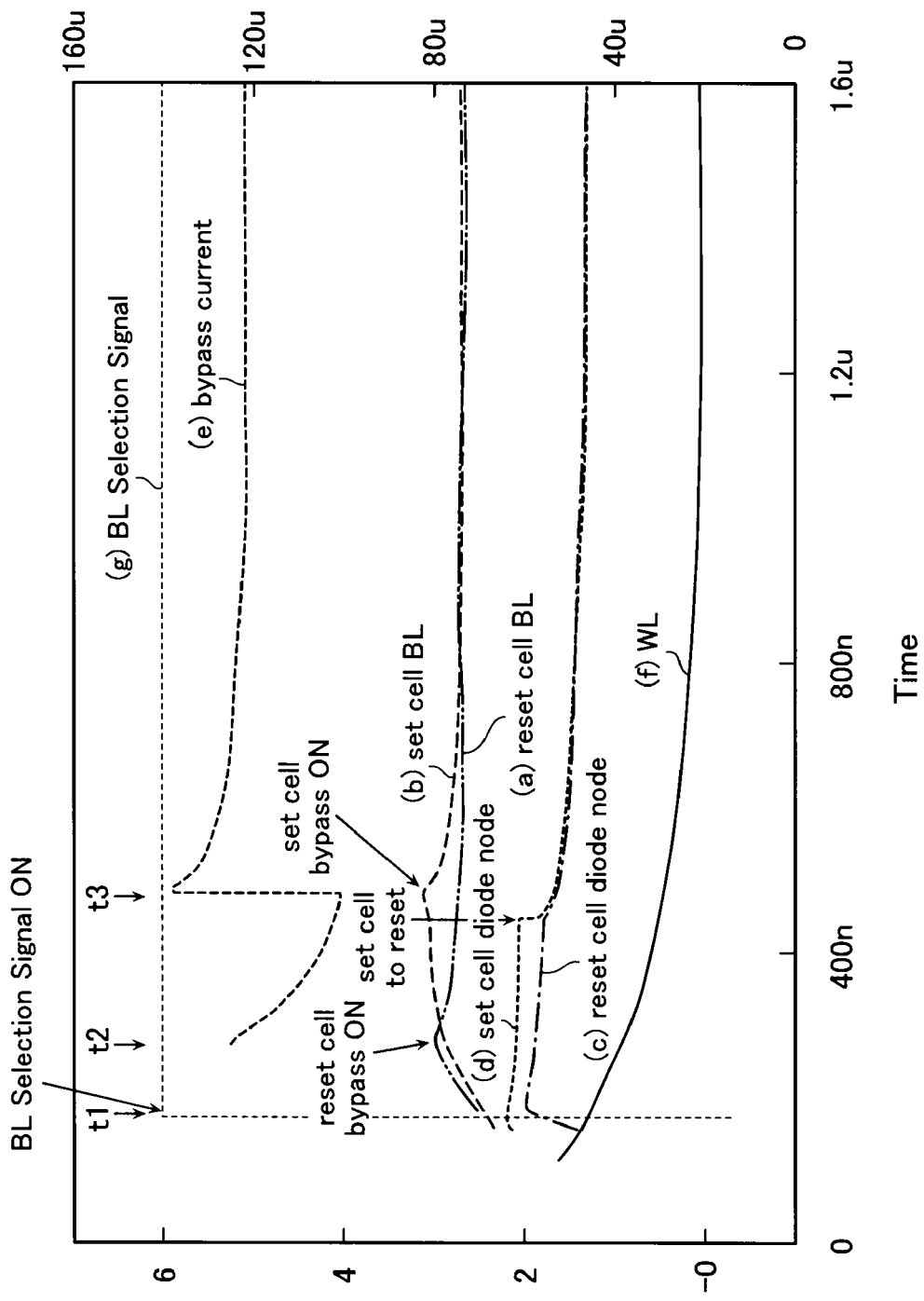
FIG. 46 shows the reset program simulation result at cell position P4 in word line section III.

FIG. 46 shows a reset-write simulation result at the same cell position P4.

The change situations of the respective nodes are about the same as those in the case of the cell position P1. The state change of the set cell occurs at about 400 ns (timing t3). It is about 4 μs earlier than the case shown in FIG. 40. This is because of that the cell voltage is applied soon in accordance with the voltage drop reduction due to the word line resistance.

The bypass circuit for the reset cell is turned on at timing t2 just after the bit line connection with the (g) BL selection signal (timing t1). This also is a result of the word line resistance reduction as similar to that shown in FIG. 44.

Figure 47:
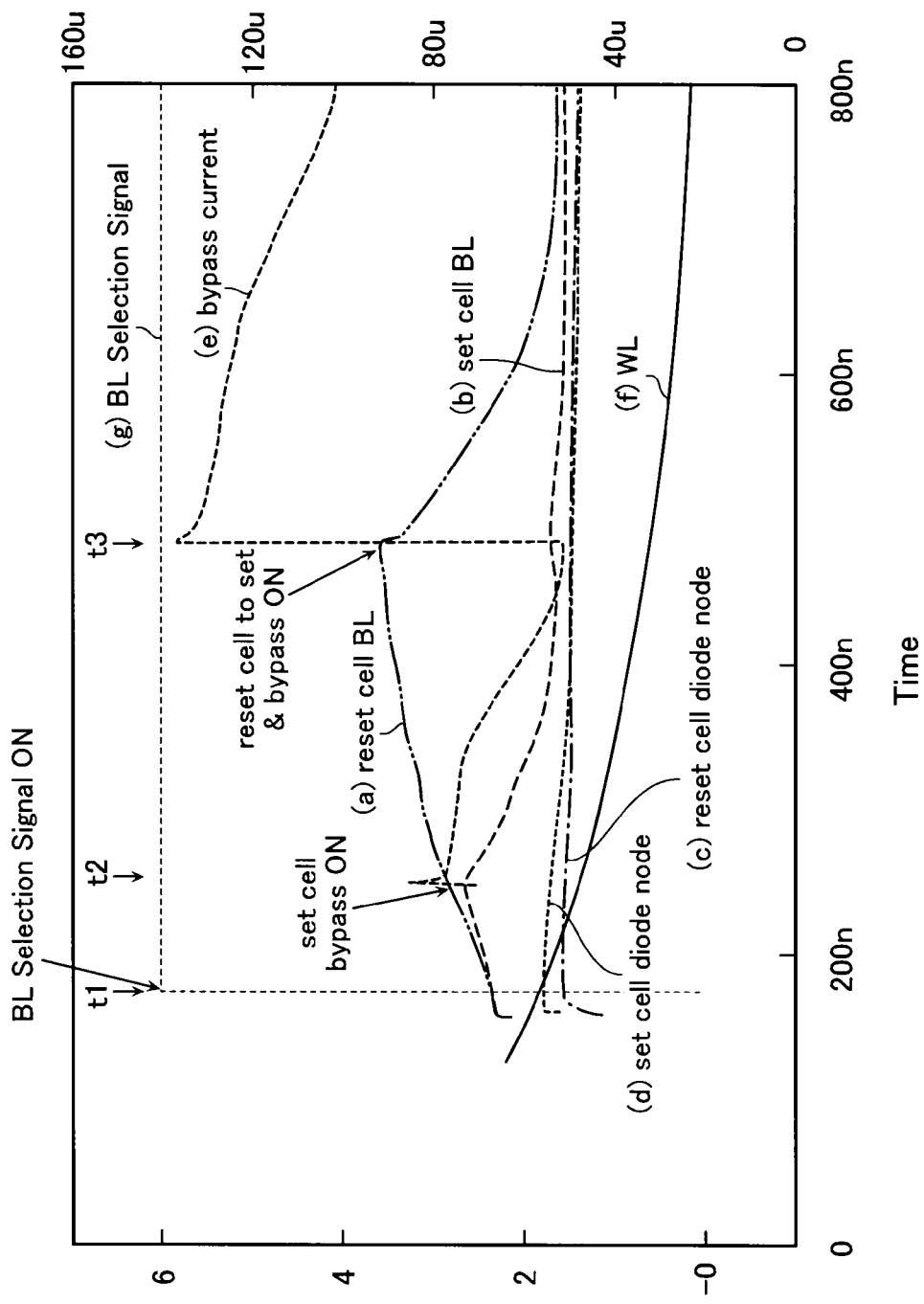
FIG. 47 shows the set program simulation result at cell position P5 in word line section N.

FIG. 47 shows a set-write simulation result at the cell position P5 in the word line section IV (i.e., at 7 kΩ position on 7 kΩ word line).

The change situations of the respective nodes are about the same as those in the case of the cell position P1. The state change of the reset cell occurs at about 500 ns (timing t3). It is about 2 μs earlier than the case shown in FIG. 39. This is because of that the cell voltage is applied soon in accordance with the voltage drop reduction due to the word line resistance.

Figure 48:
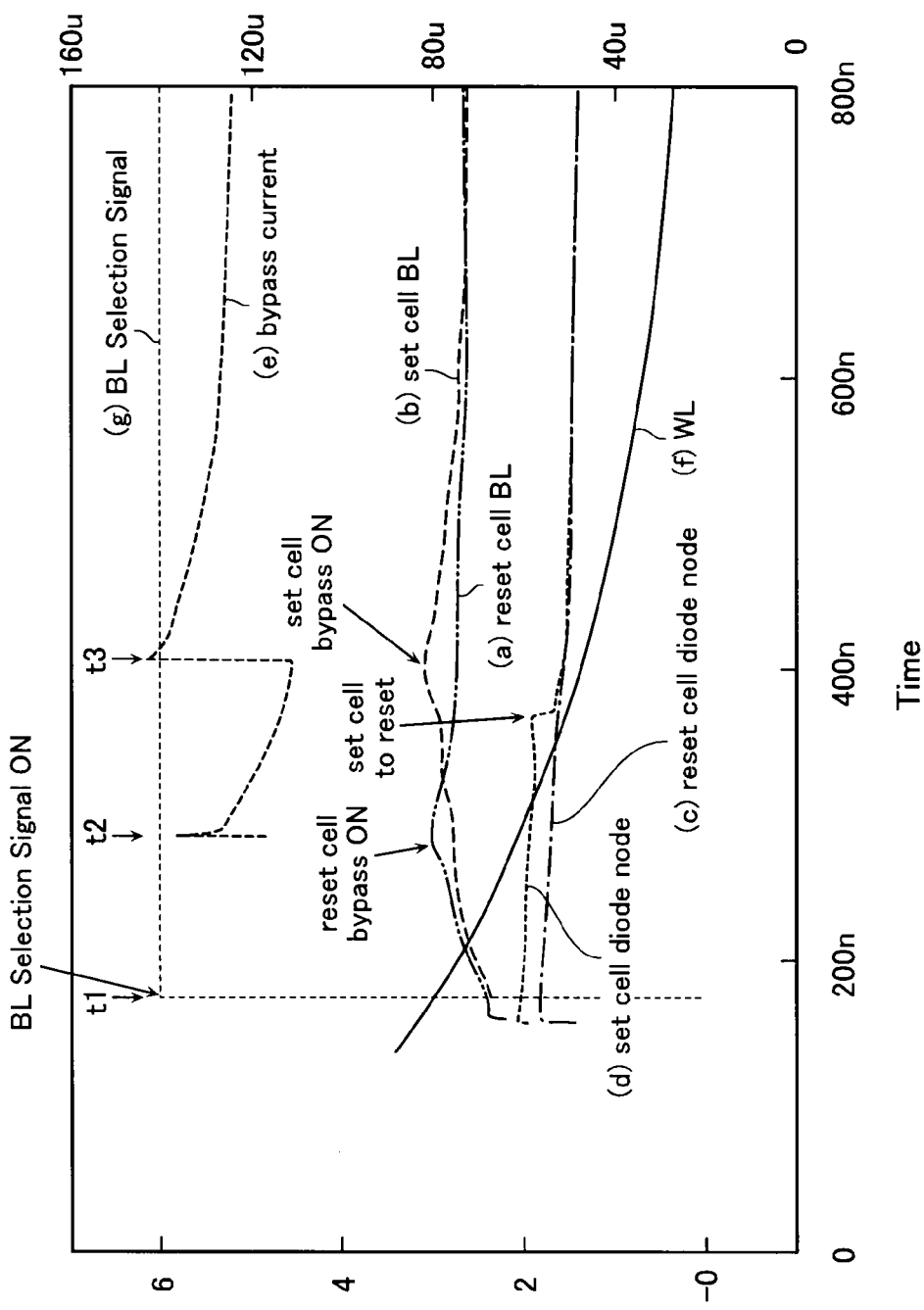
FIG. 48 shows the reset program simulation result at cell position P5 in word line section N.

FIG. 48 shows a reset-write simulation result at the same cell position P5.

The change situations of the respective nodes are about the same as those in the case of the cell position P1. The state change of the set cell occurs at about 400 ns (timing t3). It is about 2 μs earlier than the case shown in FIG. 40. This is because of that the cell voltage is applied soon in accordance with the voltage drop reduction due to the word line resistance.

Why is it the same as the cell position P4 is a result of that the width of the word line section is made to be small. The current bypass circuit of the reset cell side is turned on just after the bit line connection with the BL selection signal. This is a result of that the potential changes of the respective nodes become earlier due to the word line resistance reduction.

Figure 49:
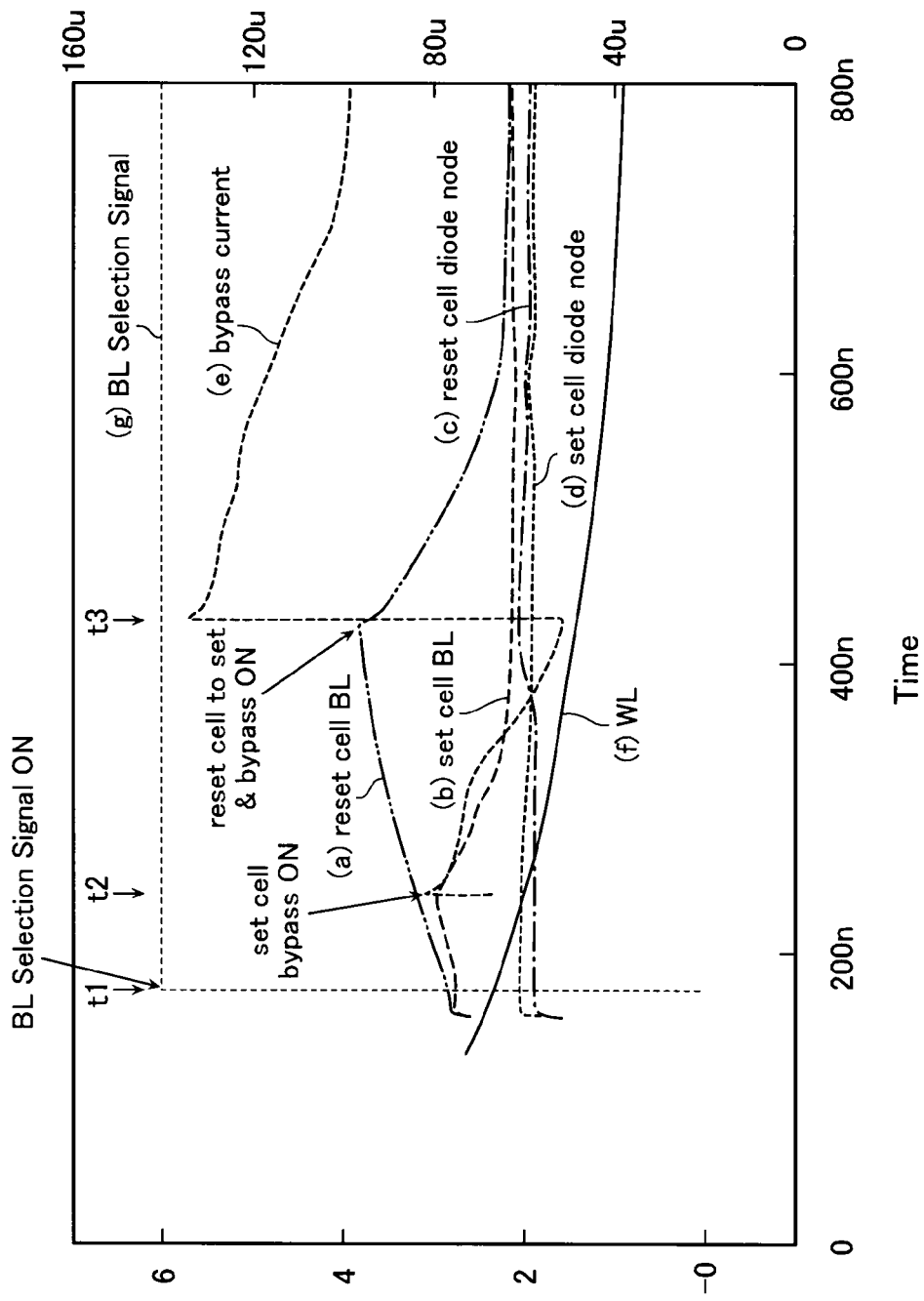
FIG. 49 shows the set program simulation result at cell position P6 in word line section N.

FIG. 49 shows a set-write simulation result at the cell position P6 in the word line section IV (i.e., at 0 kΩ position on 7 kΩ word line).

The change situations of the respective nodes are about the same as those in the case of the cell position P1. The state change of the reset cell occurs at about 450 ns (timing t3). It is about 2 μs earlier than the case shown in FIG. 39. This is because of that the cell voltage is applied soon in accordance with the voltage drop reduction due to the word line resistance.

Figure 50:
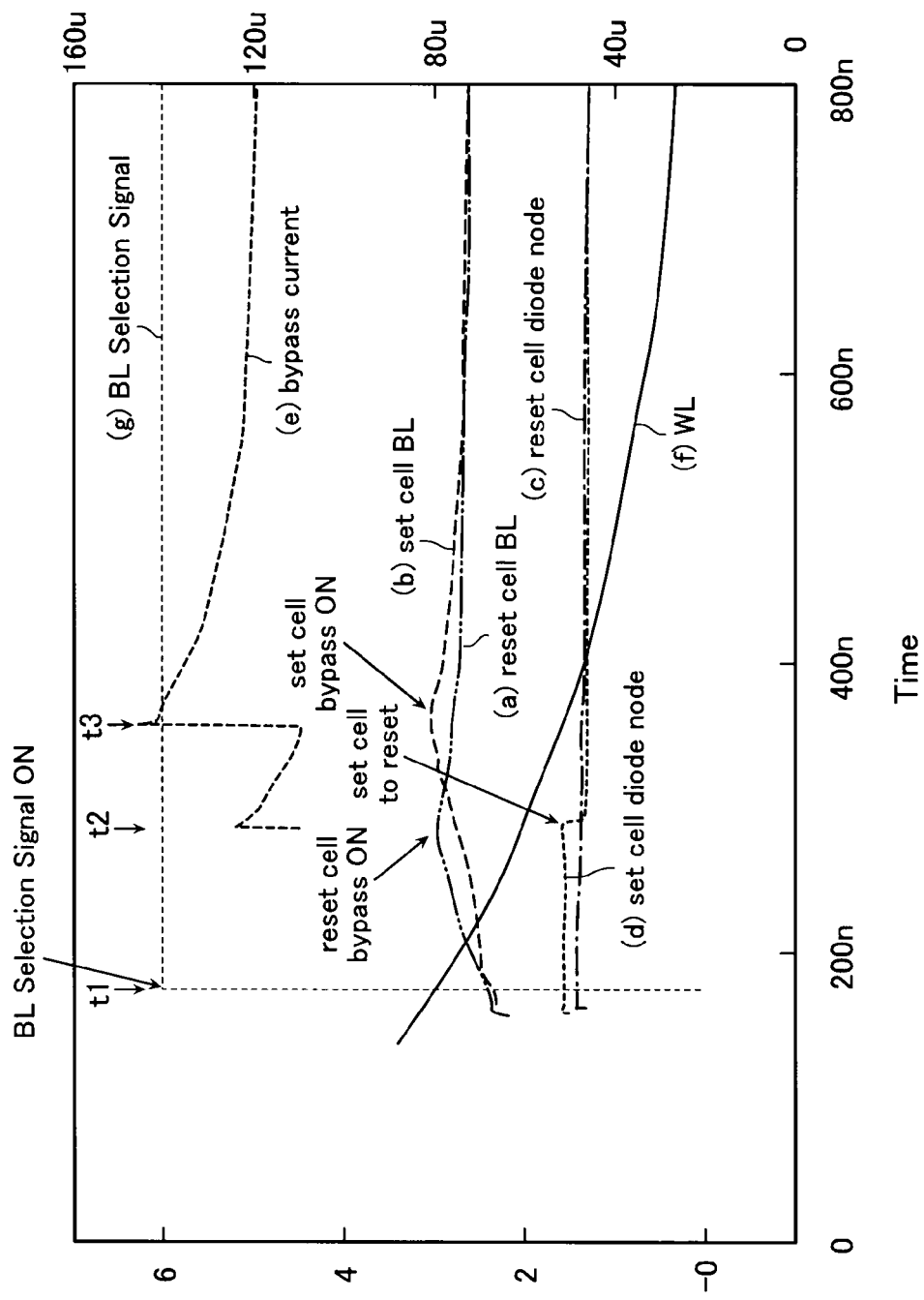
FIG. 50 shows the reset program simulation result at cell position P6 in word line section IV.

FIG. 50 shows a reset-write simulation result at the same cell position P6.

The change situations of the respective nodes are about the same as those in the case of the cell position P1. The state change of the set cell occurs at about 300 ns (timing t2). It is about 4 μs earlier than the case shown in FIG. 40. This is because of that the cell voltage is applied soon in accordance with the voltage drop reduction due to the word line resistance.

Why is it the same as the cell position P4 is a result of that the width of the word line section is made to be small. The current bypass circuit of the reset cell side is turned on just after the bit line connection with the BL selection signal. This is a result of that the potential changes of the respective nodes become earlier due to the word line resistance reduction.

It will be understood from the simulation results explained above that the write times are varied in accordance with the word line sections. In the examined system, it takes 2.5 μs to change the reset cell at the word line end to be in the set state. By contrast, the state change occurs 2 μs early for the cell on the word line driver side. In the "set to reset" write mode, the write time is 4.5 μs for the cell on the word line end while the state change occurs 4 μs early for the cell on the word line driver side.

This means that preparing speed specifications exchanged in accordance with the cell position to be written on the word line, maximum data transmission efficiency may be achieved.

Figure 51:
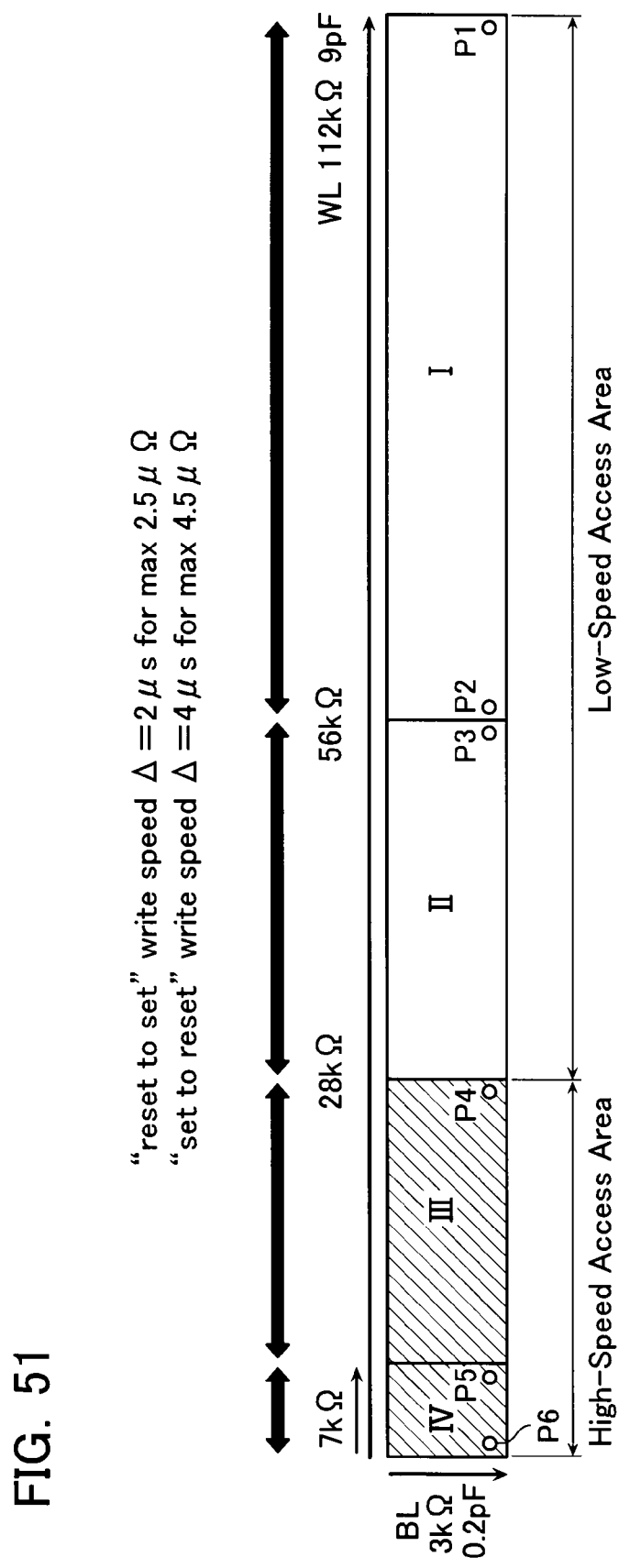
FIG. 51 shows a relationship between the word line section and the speed specification.

For example, as shown in FIG. 51, word line sections I and II are defined as a low speed access area while word line sections III and IV are defined as a high speed access area, and speed specifications are exchanged in accordance with the accessed areas. That is, when it is required of the memory to be used as a high speed one, the cell address corresponding to the high speed access area will be used. However, as understood from FIG. 51, the occupying rate of the high speed access area is less than a half of the total memory area.

The corresponding addresses on the same word line will be assigned to the high speed access area and the low speed access area in accordance with the bit line addresses.

This invention is not limited to the above-described embodiment. It will be understood by those skilled in the art that various changes in form and detail may be made without departing from the spirit, scope, and teaching of the invention.

What is claimed is:

1. A resistance change memory device comprising:
   a cell array with memory cells arranged therein, the memory cell storing a resistance state as data in a nonvolatile manner;
   a write buffer configured to supply voltage and current to a selected memory cell in accordance with data to be written in it; and
   a write control circuit configured to make a part of current supplied to the selected memory cell bypass the selected memory cell through a bypass path in accordance with the selected memory cell's state change in a write mode.

2. The resistance change memory device according to claim 1, wherein
   the write control circuit comprises:
   a current bypass circuit selectively coupled to the output node of the write buffer so as to make a part of current supplied to the selected memory cell flow out;
   a reference circuit having a reference resistance for generating a reference voltage serving for detecting the selected memory cell's state change; and
   a comparator configured to compare the voltage supplied to the selected memory cell with the reference voltage and activate the current bypass circuit.

3. The resistance change memory device according to claim 2, wherein
   the memory cell has a first data state and a second data state defined by the cell's resistance value, and wherein
   the write buffer includes a current regulating element for automatically suppressing the current of the selected memory cell after write completion in a write mode for changing the selected memory cell from the first data state to the second data state, and wherein
   the current bypass circuit is activated in another write mode for changing the selected memory cell from the second data state to the first data state.

4. The resistance change memory device according to claim 2, wherein
   the reference circuit comprises:
   a first reference resistance for generating a reference voltage in a write mode for changing the selected memory cell from a first data state to a second data state; and
   a second reference resistance for generating another reference voltage in another write mode for changing the selected memory cell from the second data state to the first data state.

5. The resistance change memory device according to claim 2, wherein
   the current bypass circuit comprises:
   a current bypass element; and
   a switch circuit configured to couple the current bypass element to the output node of the write buffer correspondingly to a write mode and to the selected memory cell's state change.

6. The resistance change memory device according to claim 1, wherein
   plural sections are defined in the cell array in accordance with address, and the write buffer and the write control circuit are set in the respective operation conditions correspondingly to the sections of the cell array.

7. The resistance change memory device according to claim 1, wherein
   the cell array comprises word lines and bit lines crossing each other, and the memory cells disposed at the cross points, plural word line sections being defined on the word line in accordance with its resistance value, multiple memory cells selected on a selected word line being simultaneously written in a write mode, and wherein
   the write buffers and the write control circuits prepared for the simultaneously written memory cells, respectively, are set in the respective operation conditions correspondingly to the word line sections, to which the simultaneously written memory cells belong.

8. The resistance change memory device according to claim 7, wherein
   the write control circuits each comprises:
   a reference resistance for generating a reference voltage serving for detecting a selected memory cell's state change; and
   a mimic word line coupled to the reference resistance in the write mode, the resistance value of the mimic word line being adjusted in accordance with the word line section.

9. A resistance change memory device comprising:
   a cell array with a resistance change-type of memory cells arranged therein, the memory cells being disposed at cross points between word lines and bit lines arranged to cross each other;
   a write buffer configured to supply voltage and current to a selected memory cell in the cell array in accordance with data to be written in it;
   a current bypass circuit selectively coupled to the output node of the write buffer so as to make a part of current supplied to the selected memory cell flow out;

a reference circuit having a reference resistance for generating a reference voltage serving for detecting the selected memory cell's state change; and a mimic word line circuit having a mimic word line coupled to the reference circuit, the resistance value of the mimic word line being adjusted in accordance with the selected cell's position on a selected word line.

10. The resistance change memory device according to claim 9, further comprising:

a comparator configured to compare the voltage supplied to the selected memory cell with the reference voltage and activate the current bypass circuit.

11. The resistance change memory device according to claim 9, wherein the memory cell has a first data state and a second data state defined by the cell's resistance value, and wherein the write buffer includes a current regulating element for automatically suppressing the current of the selected memory cell after write completion in a write mode for changing the selected memory cell from the first data state to the second data state, and wherein the current bypass circuit is activated in another write mode for changing the selected memory cell from the second data state to the first data state.

12. The resistance change memory device according to claim 9, wherein the reference circuit comprises:

a first reference resistance for generating a reference voltage in a write mode for changing the selected memory cell from a first data state to a second data state; and a second reference resistance for generating another reference voltage in another write mode for changing the selected memory cell from the second data state to the first data state.

13. The resistance change memory device according to claim 12, wherein the mimic word line circuit comprises first and second mimic word lines to be coupled to the first and second reference resistances, respectively.

14. The resistance change memory device according to claim 9, wherein the current bypass circuit comprises:
a current bypass element; and a switch circuit configured to couple the current bypass element to the output node of the write buffer correspondingly to a write mode and to the selected memory cell's state change.

15. The resistance change memory device according to claim 9, wherein plural word line sections are defined on the word line in accordance with its resistance value, and the mimic word line is adjusted in resistance value in correspondence with a selected word line section, to which the selected memory cell belongs.

16. The resistance change memory device according to claim 15, wherein the word line sections are grouped into multiple areas, to which different access-speed specifications are assigned.

17. The resistance change memory device according to claim 9, wherein multiple memory cells are selected on a selected word line to be simultaneously written in a write mode, and wherein the write buffer, the current bypass circuit, the reference circuit and the mimic word line circuit are prepared in correspondence to each of the multiple memory cells to be simultaneously written.

18. The resistance change memory device according to claim 17, wherein the multiple memory cells to be simultaneously written are sequentially subjected to first and second write procedures, the first write procedure being for changing one cell group in a first data state to have a second data state, the second write procedure being for changing the other cell group in the second data state to have the first data state.

19. The resistance change memory device according to claim 18, wherein in one of the first and second write procedures, in which the cell data change is defined by a current mode, the cell group is further divided into multiple sub-groups to be sequentially accessed.

* * * * *